United States Patent
Mikoshiba

(10) Patent No.: US 7,235,415 B2
(45) Date of Patent: Jun. 26, 2007

(54) FILM PATTERN FORMATION METHOD, DEVICE AND METHOD FOR MANUFACTURING THE SAME, ELECTRO-OPTICAL DEVICE, ELECTRONIC DEVICE, AND METHOD FOR MANUFACTURING ACTIVE MATRIX SUBSTRATE

(75) Inventor: Toshiaki Mikoshiba, Suwa (JP)

(73) Assignee: Seiko Epson Corporation, Tokyo (JP)

(*) Notice: Subject to any disclaimer, the term of this patent is extended or adjusted under 35 U.S.C. 154(b) by 399 days.

(21) Appl. No.: 10/848,604

(22) Filed: May 19, 2004

(65) Prior Publication Data

US 2005/0064633 A1   Mar. 24, 2005

(30) Foreign Application Priority Data

May 28, 2003 (JP) ............................ 2003-151288
May 28, 2003 (JP) ............................ 2003-151289
Mar. 29, 2004 (JP) ............................ 2004-095975

(51) Int. Cl.
  *H01L 21/00* (2006.01)
(52) U.S. Cl. ........................................................ 438/21
(58) Field of Classification Search ................ 438/497, 438/21
  See application file for complete search history.

(56) References Cited

U.S. PATENT DOCUMENTS 6,524,876 B1   2/2003   Baek et al.
6,715,871 B2   4/2004   Hashimoto et al.
6,734,029 B2   5/2004   Furusawa

FOREIGN PATENT DOCUMENTS

| EP | 0 989 778 A1 | 3/2000 |
|---|---|---|
| JP | A 11-204529 | 7/1999 |
| JP | A 11-207959 | 8/1999 |
| JP | A 11-274671 | 10/1999 |
| JP | A 2000-216330 | 8/2000 |
| JP | A 2002-164635 | 6/2002 |
| JP | A 2003-80694 | 3/2003 |
| JP | A 2003-1336691 | 5/2003 |
| KR | 2001-0009269 A | 2/2001 |
| WO | WO 99/48339 | 9/1999 |
| WO | WO 01/47045 A1 | 6/2001 |

*Primary Examiner*—W. David Coleman
(74) *Attorney, Agent, or Firm*—Oliff & Berridge, PLC

(57) ABSTRACT

A method for forming a film pattern on a substrate includes the steps of: forming banks on the substrate; and making liquid drops of functional liquid land on the substrate to dispose the liquid drops in an area partitioned by the banks, wherein a spacing between the liquid drops are determined so that the liquid drops connect together after they land on the substrate, and a position in which a liquid drop of the liquid drops which lands the closest to an end of the area is spaced from the end of the area by less than a half of the spacing between the liquid drops.

22 Claims, 18 Drawing Sheets

FILM PATTERN FORMATION METHOD, DEVICE AND METHOD FOR MANUFACTURING THE SAME, ELECTRO-OPTICAL DEVICE, ELECTRONIC DEVICE, AND METHOD FOR MANUFACTURING ACTIVE MATRIX SUBSTRATE

BACKGROUND OF THE INVENTION

1. Field of the Invention

The present invention relates to a film pattern formation method, a device and method for manufacturing the same, an electro-optical device, an electronic device, and a method for manufacturing an active matrix substrate.

Priority is claimed on Japanese Patent Application Nos. 2003-151288 and 2003-151289 filed May 28, 2003, and Japanese Patent Application No. 2004-095975, filed Mar. 29, 2004, the contents of which are incorporated herein by reference.

2. Description of Related Art

As a method for forming film patterns, e.g., wiring patterns, used in electronic circuits or integrated circuits, a photolithography method is used, for example. The photolithography method requires large equipment, such as vacuum equipment, and complex processing steps. In addition, the manufacturing cost of the photolithography method is high since the efficiency of material usage is as low as several percent, and most of the material needs to be disposed of.

On the other hand, a liquid drop ejection method for forming film patterns on a substrate by ejecting liquid material from a liquid drop ejection head, a so-called ink jet method, has been proposed (for example, Japanese Unexamined Patent Nos. H11-274671 and 2000-216330). In this method, liquid material (functional liquid) is directly disposed on a substrate while forming patterns, and then transformed it into film patterns by thermal treatment or laser irradiation. This method greatly simplifies a pattern formation process by eliminating the need for photolithography, as well as having an advantage of requiring less material.

In recent years, increase in density of the circuitry of such devices has progressed, and there are further demands for further progress in the fineness of the wiring and the further miniaturization thereof. In the film pattern formation method using the liquid drop ejection method described above, since ejected liquid drops spread on the substrate after they land on the substrate, it has been difficult to form fine film patterns in a stable manner.

The present invention has been conceived in light of the above-described situation, and it takes as its object the provision of a film pattern formation method with which fine film patterns can be formed with high precision in a stable manner.

SUMMARY OF THE INVENTION

The present invention adopts the following aspects in order to achieve the object mentioned above.

A film pattern formation method according to the present invention forms a film pattern on a substrate, and includes the steps of: forming banks on the substrate; and making liquid drops of functional liquid land on the substrate to dispose the liquid drops in an area partitioned by the banks, wherein a spacing between the liquid drops are determined so that the liquid drops connect together after they land on the substrate, and a position in which a liquid drop of the liquid drops which lands the closest to an end of the area is spaced from the end of the area by less than a half of the spacing between the liquid drops.

In the film pattern formation method according to the present invention, the functional liquid is disposed in the area partitioned by banks, and a film pattern is formed on the substrate after the functional liquid is dried, for example. In this case, since the shape of film patterns are defined by the banks, further progress in the fineness of a film pattern and the further miniaturization thereof can be attained by forming the banks appropriately, for example, by reducing the width of a groove defined by the banks.

Furthermore, in the film pattern formation method according to the present invention, since the spacing between the liquid drops and the landing position of the liquid drop closest to the end of the area are determined in the manner described above, it is assured that the liquid drops spread to ends of the area and that the functional liquids are disposed in the area without gaps. Accordingly, film patterns can be formed in a stable manner using the film pattern formation method according to the present invention.

Furthermore, in the film pattern formation method described above, the distance between the landing position of the liquid drop which is located closest to the end of the area and the one end of the area may be y/2, where "d" is a length of the area, "h" is the spacing between the liquid drops, and "y" is a remainder obtained by dividing "d" by "h".

In this case, at both ends in the longitudinal direction, the distance between the end of the area and the landing position of the liquid drop becomes equal to or less than a half of the spacing between the liquid drops. Therefore, it is assured that the liquid drops spread to the ends at the both ends in the longitudinal direction. In addition, in this case, since the distance between the end of the area and the landing position of the liquid drop becomes equal to the distance between the opposing end of the area and the position at which a liquid drop which is placed closest to the opposing end, the functional liquid is more uniformly disposed in the area.

Furthermore, since the functional liquid contains electrically conductive particles, conductive film patterns are formed. Thus, such film patterns are applied to various devices as wiring. Yet furthermore, it is possible to select functional liquid which develops electrical conductivity by thermal treatment or irradiation with light.

A method for manufacturing a device according to the present invention is a method for manufacturing a device by forming a film pattern on a substrate, and includes the step of forming a film pattern on a substrate using the above-mentioned film pattern formation method.

In the method for manufacturing a device according to the present invention, further progress in the fineness of a film pattern formed on the substrate and the further miniaturization thereof can be attained. Accordingly, high-precision devices can be manufactured in a stable manner.

Especially when the film patterns are constituents of a switching device of a TFT (film transistors) or the like which is provided on the substrate, high-density switching devices can be obtained.

Since the device according to the present invention is manufactured using the above-mentioned device manufacturing method, the device has a high precision.

A film pattern formation method according to the present invention forms a film pattern on a substrate, and includes the steps of: forming a liquid repelling layer in a predetermined pattern which is endowed with liquid repellency to functional liquid on the substrate; disposing the functional liquid in an area partitioned by the liquid repelling layer, wherein a spacing between the liquid drops are determined so that the liquid drops connect together after they land on the substrate, and a position in which a liquid drop of the liquid drops which lands the closest to an end of the area is spaced from the end of the area by less than a half of the spacing between the liquid drops.

In the film pattern formation method according to the present invention, the functional liquid is disposed in the area defined by the liquid repelling layer, and a film pattern is formed on the substrate after the functional liquid is dried, for example. In this case, since the shape of the film patterns are defined by the liquid repelling layer, further progress in the fineness of the wiring and the further miniaturization thereof can be attained by designing the shape of liquid repelling layer appropriately, for example, by reducing the width of the area. Furthermore, in the film pattern formation method according to the present invention, since the spacing between the liquid drops and the landing position of the liquid drop closest to the end of the area are determined in the manner described above, it is assured that the liquid drops spread to ends of the area and that the functional liquids are disposed in the area without gaps. Accordingly, film patterns can be formed in a stable manner using the film pattern formation method according to the present invention.

Furthermore, in the film pattern formation method described above, the distance between the landing position of the liquid drop which is located closest to the end of the area and the one end of the area may be y/2, where "d" is a length of the area, "h" is the spacing between the liquid drops, and "y" is a remainder obtained by dividing "d" by "h".

In this case, at both ends in the longitudinal direction, the distance between the end of the area and the landing position of the liquid drop becomes equal to or less than a half of the spacing between the liquid drops. Therefore, it is assured that the liquid drops spread to the ends at the both ends in the longitudinal direction. In addition, in this case, since the distance between the end of the area and the landing position of the liquid drop becomes equal to the distance between the opposing end of the area and the position at which a liquid drop which is placed closest to the opposing end, the functional liquid is more uniformly disposed in the area.

Furthermore, since the functional liquid contains electrically conductive particles, conductive film patterns are formed. Thus, such film patterns are applied to various devices as wiring. Yet furthermore, it is possible to select functional liquid which develops electrical conductivity by thermal treatment or irradiation with light.

A method for manufacturing a device according to the present invention is a method for manufacturing a device by forming a film pattern on a substrate, and includes the step of forming a film pattern on a substrate using the above-mentioned film pattern formation method.

In the method for manufacturing a device according to the present invention, further progress in the fineness of a film pattern formed on the substrate and the further miniaturization thereof can be attained. Accordingly, high-precision devices can be manufactured in a stable manner.

Especially when the film patterns are constituents of a switching device of a TFT (film transistors) or the like which is provided on the substrate, high-density switching devices can be obtained.

Since the device according to the present invention is manufactured using the above-mentioned device manufacturing method, the device has a high precision.

A method for manufacturing an active matrix substrate according to the present invention includes: a first step of forming a gate lead line on a substrate; a second step of forming a gate insulation layer on the gate lead line; a third step of forming a semiconductor layer on the gate insulation layer; a fourth step of forming a source electrode and a drain electrode on the gate insulation layer; a fifth step of disposing an insulation material on the source electrode and the drain electrode; and a sixth step of forming a pixel electrode which is electrically connected to the drain electrode; wherein at least one of the first step, the fourth step, and the sixth step includes the steps of: forming banks in a predetermined pattern on the substrate; and making liquid drops of functional liquid land on the substrate to dispose the liquid drops in an area partitioned by the banks, and a spacing between the liquid drops are determined so that the liquid drops connect together after they land on the substrate, and a position in which a liquid drop of the liquid drops which lands the closest to an end of the area is spaced from the end of the area by less than a half of the spacing between the liquid drops.

According to the present invention as described above, since fine film patterns can be formed with high precision in a stable manner, accordingly, it is possible to manufacture an active matrix substrate which can provide the desired performance.

A method for manufacturing an active matrix substrate according to the present invention includes: a first step of forming a gate lead line on a substrate; a second step of forming a gate insulation layer on the gate lead line; a third step of forming a semiconductor layer on the gate insulation layer; a fourth step of forming a source electrode and a drain electrode on the gate insulation layer; a fifth step of disposing an insulation material on the source electrode and the drain electrode; and a sixth step of forming a pixel electrode which is electrically connected to the drain electrode; wherein at least one of the first step, the fourth step, and the sixth step includes the steps of: forming a liquid repelling layer which has liquid repellency to functional liquid in a pattern according to the film pattern on the substrate; and making liquid drops of the functional liquid land on the substrate to dispose the liquid drops in an area partitioned by the liquid repelling layer, wherein a spacing between the liquid drops are determined so that the liquid drops connect together after they land on the substrate, and a position in which a liquid drop of the liquid drops which lands the closest to an end of the area is spaced from the end of the area by less than a half of the spacing between the liquid drops.

According to the present invention as described above, since fine film patterns can be formed with high precision in a stable manner, accordingly, it is possible to manufacture an active matrix substrate which can provide the desired performance.

DETAILED DESCRIPTION OF THE INVENTION

First Embodiment

Hereafter, the present invention will be described with reference to the drawings.

Figure 1:
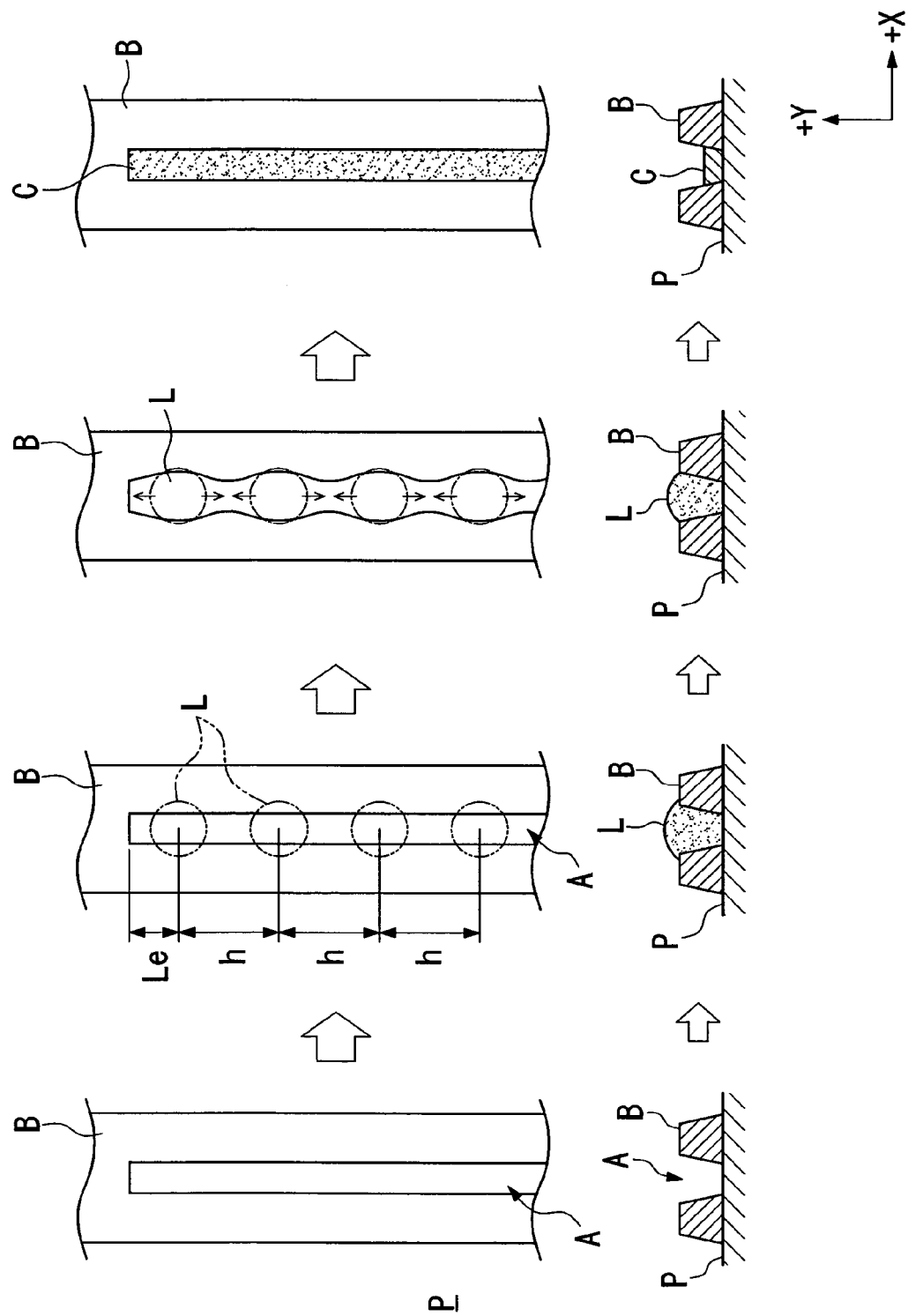
FIG. 1 is a diagram schematically illustrating a film pattern formation method according to the present invention.

FIG. 1 is a diagram schematically illustrating a film pattern formation method according to the present invention.

The film pattern formation method according to the present invention includes a bank formation step for forming banks B on a substrate P, and a material disposing step for disposing functional liquid L in a linear area (linear area A) which is partitioned by the banks B by making liquid drops of functional liquid L land on the substrate P.

In the film pattern formation method according to the present invention, the functional liquid L is disposed in the partitioned area A partitioned by the banks B, and a film pattern C is formed on the substrate P after the functional liquid L is dried, for example. In this case, since film patterns are defined by the banks B, further progress in the fineness of a film pattern C and the further miniaturization of a film pattern C can be attained by forming the banks B appropriately, for example, by reducing the width of a groove defined by the banks B. The banks B may be removed from the substrate P. or may be left on the substrate P after the film pattern C is formed.

In the material disposing step, liquid drops of the functional liquid L are repeatedly made to land on the substrate P with a predetermined pitch (the landing spacing "h"). As a method for disposing the functional liquid L, a liquid drop ejection method, a so-called ink jet method, is used, for example. The liquid drop ejection method has an advantage over other coating methods, such as spin coating, in that the liquid material is efficiently consumed, and the amount and positions of the functional liquid to be disposed on the substrate can be easily controlled.

In the liquid drop ejection method, liquid drops are repeatedly made to land on the substrate P while shifting a liquid drop ejection head and the substrate P relative to each other. Since the relative shifting speed is usually constant, the landing spacing "h" (i.e., ejection pitch) of the liquid drops with respect to the direction of the above-mentioned relative shifting becomes constant. An apparatus for ejecting liquid drops for the liquid drop ejection method will be described later in detail.

In the present invention, the landing spacing "h" is set to a spacing with which liquid drops connect together in the linear area A after landing, and is determined properly according to the properties of the functional liquid L (e.g., viscosity), the amount of the liquid drops, the width of the linear area, surface characteristics of the banks B and the substrate P or the like. In this case, a liquid drop which landed on the substrate P will spread on the linear area due to phenomena such as capillary phenomenon, and connect to other liquid drops. A plurality of liquid drops connect together, and the functional liquid L is filled within the linear area A.

Furthermore, in the material disposing step, the distance "Le" between an end of the linear area A and the position at which a liquid drop which landed closest to the end of the linear area A is set to equal to or less than a half of the landing spacing "h" between the liquid drops.

As described above, since the landing spacing "h" is set to a spacing with which liquid drops connect together in the linear area A after landing, in the linear area A, liquid drop will spread by at least a half of the landing spacing "h" in one direction (in the direction along which liquid drops are aligned, for example, +Y direction shown in FIG. 1). Therefore, since the distance "Le" between an end of the linear area A and the position at which a liquid drop which landed closest to the end of the linear area A is equal to or less than a half of the landing spacing "h", it is assured that the liquid drop which landed closest to the end will spread to the end of the linear area A. Since a plurality of liquid drops connect together in the linear area A, and moreover, the liquid drops spread to the ends of the linear area A, the functional liquid L is disposed within the linear area A without gaps.

Figure 2:
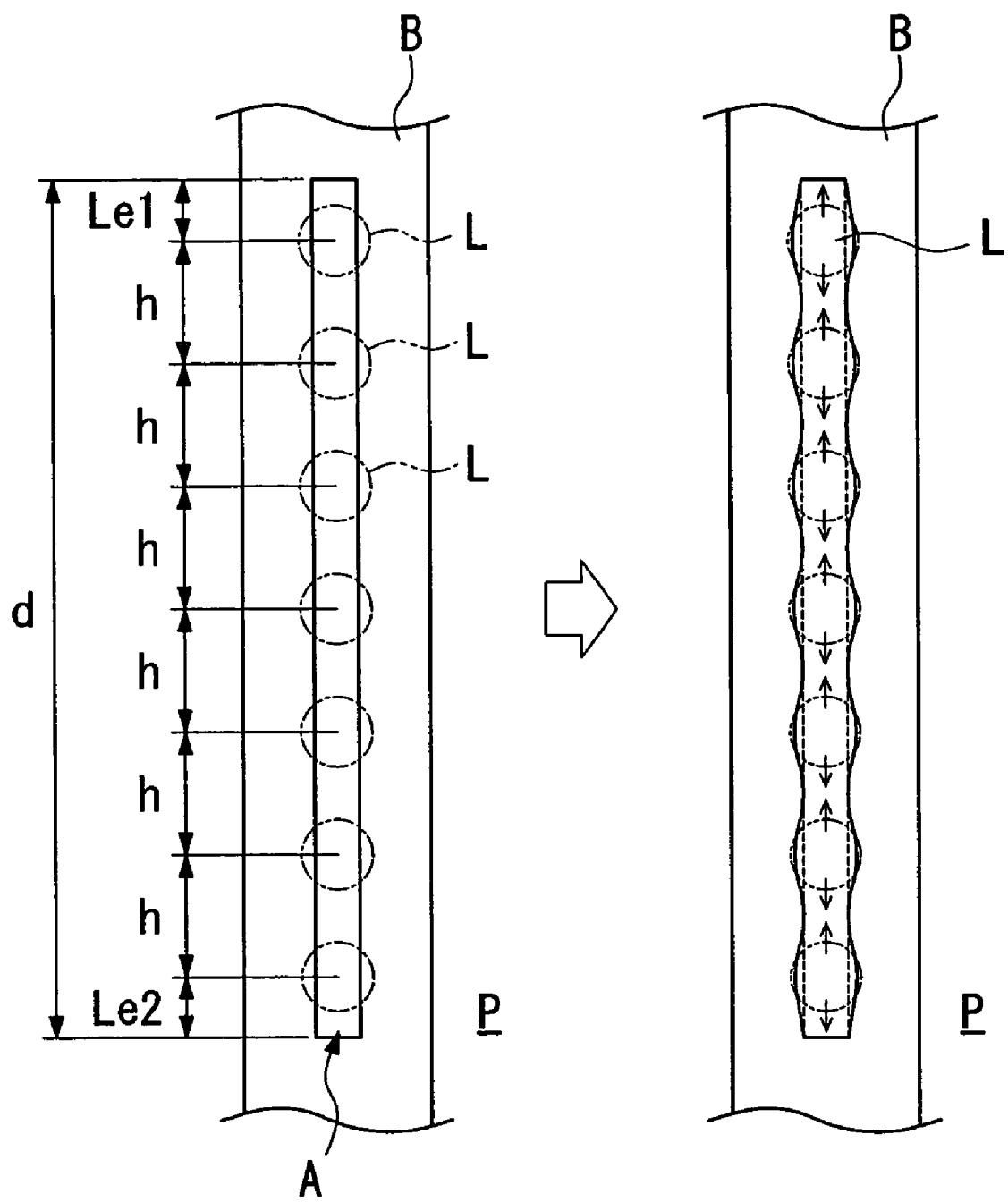
FIG. 2 is a diagram illustrating the relationship between the length of the linear area and the landing positions at ends of the linear area.

As shown in FIG. 2, the distance "Le" between an end of the linear area A and the position at which a liquid drop which landed closest to the end of the linear area A is preferably y/2, where "d" is the length of the linear area A, "h" is the spacing between the liquid drops, and "y" is a remainder obtained by dividing "d" by "h".

For example, if "d" is 270 μm and "h" is 40 μm, the remainder "h" obtained by dividing "d" becomes 30 μm. In this case, since the distances "Le1" and "Le2" between an end of the linear area and the position at which a liquid drop closest to the end of the linear area A is landed are equal to or less than h/2 (=20 μm), the liquid drops will spread to the ends of the linear area A. Yet furthermore, since the distances "Le1" and "Le2" are y/2(=15 μm), the distances "Le1" and "Le2" between an end of the linear area and the position at which a liquid drop closest to the end of the linear area A is landed become equal to each other at the both ends of the linear area A (Le1=Le2). Since liquid drops are evenly disposed at the longitudinal direction of linear area A, the functional liquid L is disposed more evenly within the linear area A.

It should be understood that although the linear area A with a uniform width is preferably used, the present invention is not limited to such a linear area. The width of linear area may be varied partially in the area or in the whole area.

Referring again to FIG. 1, as a substrate P on which a wiring pattern is formed, it is possible to use various kinds of material, such as glass, quartz glass, a Si wafer, a plastic film, and a metal plate. Furthermore, as an under-layer on the surface of such a raw material substrate, it would also be possible to include a semiconductive layer, a metallic layer, a dielectric layer, an organic layer, or the like.

The formation of these banks B may be performed using any suitable method, such as a photolithography method or a printing method or the like. For example, when a photolithography method is used, after forming a layer made of the material to be utilized for forming the banks on the substrate P. by a predetermined method such as spin coating, spray coating, roll coating, dye coating, dip coating, or the like, a bank B with a predetermined pattern is obtained by patterning the layer by etching, ashing, or the like. It should be understood that the banks B may be formed on another object than the substrate P, and then the resulting banks B may be placed on the substrate P.

Furthermore, it is possible to utilize material containing an inorganic substance, such as silica, as the material to be utilized for forming the banks B, in addition to a high molecular weight material such as acrylic resin, polyimide resin, olefin resin, melamine resin, or the like.

Furthermore, various materials may be used as the functional liquid L of the present invention and an ink for forming wiring patterns which contains electrically conductive particles is used, for example.

The ink for forming wiring patterns is made of a dispersion liquid in which electrically conductive particles are dispersed in a dispersion medium.

The electrically conductive particles, in addition to being metallic particles which include any of gold, silver, copper, palladium, or nickel or the like, or an oxide thereof, may also be made from an electrically conductive polymer or a superconducting material or the like.

A coating such as an organic material or the like may also be used on the surface of these electrically conductive particles, in order to enhance their dispersibility.

It is preferable for the diameter of the electrically conductive particles to be greater than or equal to 1 nm and less than or equal to 0.1 µm. If this diameter becomes greater than 0.1 µm, it may be possible that the nozzle of a liquid drop ejection head described later may be clogged. On the other hand, if this diameter is less than 1 nm, the ratio of the volume of the coating material to the volume of the electrically conductive particles becomes rather large, which results in excessive organic material in the resulting layer.

The dispersion medium is not to be considered as being particularly limited, provided that it is capable of dispersing the above-described electrically conductive particles, and provided that it does not cause agglomeration of the particles. For example, as possible polar compounds, other than water, there may be cited, for example, alcohols such as methanol, ethanol, propanol, butanol and the like; hydrocarbons such as n-heptane, n-octane, decane, tetradecane, toluene, xylene, cymene, durene, indene, dipentene, tetrahydronaphthalene, decahydronaphthalene, cyclohexylbenzene and the like; ethers such as ethylene glycol dimethyl ether, ethylene glycol diethyl ether, ethylene glycol methyl ethyl ether, diethylene glycol dimethyl ether, diethylene glycol methyl ethyl ether, diethylene glycol methylethyl ether, 1,2-dimethoxy ethane, bis-(2-methoxy ethyl)-ether, p-dioxane, and the like; or polar compounds such as propylene carbonate, γ-butylolactone, N-methyl-2-pyrolidone, dimethyl formamide, dimethyl sulfoxide, cyclohexanone or the like. Among these, from the point of view of dispersibility of the particles and stability of the dispersion liquid, and from the point of view of ease of application to the liquid drop ejection method, the use of water, alcohols, hydrocarbons, or ethers are preferable; and, as a more desirable dispersion medium, water or hydrocarbons are even more preferable.

It is preferable for the surface tension of the dispersion liquid of the above-described electrically conductive particles to be within the range of greater than or equal to 0.02 N/m and less than or equal to 0.07 N/m. When ejecting a liquid using a liquid drop ejection method, if the surface tension is less than 0.02 N/m, it becomes easy for deviations during ejection of the liquid drops to occur, since the wettability of the ink composition with respect to the surface of the nozzle is increased, while if the surface tension exceeds 0.07 N/m, it becomes difficult to control the ejection amount and the ejection timing, since the shape of the meniscus at the nozzle tip becomes unstable. In order thus to adjust the surface tension, it will be acceptable to add to the above-described dispersion liquid, in very small amount, within the range in which the contact angle with the substrate does not greatly decrease, a surface tension modifier such as a fluorine-containing, a silicon-containing, or a non-ionic material, or the like. A non-ionic surface tension modifier increases the wettability of the liquid to the substrate, and improves-the quality of leveling of the resulting layer, and is a material which serves to prevent the generation of minute concavities and convexities in this layer. It will also be acceptable, according to requirements, to include an organic compound such as an alcohol, an ether, an ester, a ketone or the like in the above-described surface tension modifier.

It is preferable for the viscosity of the above-described dispersion liquid to be greater than or equal to 1 mPa·s and less than or equal to 50 mPa·s. When ejecting liquid drops of this liquid material using a liquid drop ejection method, if the viscosity is less than 1 mPa·s, the portion surrounding the vicinity of the nozzle can easily be contaminated by the ink as it flows out of the nozzle, while if the viscosity is greater than 50 mPa·s, it becomes difficult to eject liquid drops in a smooth manner, because the hole in the nozzle may be frequently clogged.

As a liquid drop ejection method, it is possible to suggest an electrification control method, a pressure vibration method, an electro-mechanical conversion method, an electro-thermal conversion method, an electrostatic expulsion method, or the like. An electrification control method is one in which an electric charge is imported to the material by a charging electrode, and the material is ejected from the nozzle while its direction of emission is controlled by a deflection electrode. Furthermore, a pressure vibration control method is one in which a high pressure of about 30 kg/cm$^2$ is applied to the material so that it is ejected from the tip of the nozzle, so that, if no control voltage is applied, the material is ejected from the nozzle in a straight line, while if a control voltage is applied, electrostatic repulsion is engendered between the various portions of the material, so that the material is scattered and is not ejected in a straight line from the nozzle. Yet furthermore, an electro-mechanical conversion control method is one which takes advantage of the characteristic that a piezo element (a piezo-electric element) deforms when it is subjected to a pulse type electrical signal, by applying a pressure by such a deformation of a piezo element, via a flexible member, to a space in which the material is stored, so that material is pushed out from this space to be ejected from the nozzle.

Even furthermore, an electro-thermal conversion method is one in which the material is heated up by a heater provided within a space in which it is stored, and is abruptly vaporized so that bubbles are generated therein, and then the material within this space is ejected therefrom due to the pressure of the bubbles. Finally, an electrostatic expulsion method is one in which a very small pressure is applied to the material within the space in which it is stored, so that a meniscus is created upon the material at a nozzle, and then, in this state, the material is ejected by subjecting it to electrostatic attraction. Furthermore, in addition to these, it is also possible to apply techniques such as a method which takes advantage of the change of viscosity of a liquid due to an electric field, or a method in which the liquid is caused to be ejected by an electric spark discharge, or the like. These liquid drop ejection methods do not waste any material; rather, they have the advantageous feature that they can dispose an appropriate and desired amount of liquid material in the desired position. It should be understood that the amount of the liquid material (i.e., fluid) in a single drop of the functional liquid which is ejected by any one of these liquid drop ejection methods is, for example, from 1 to 300 nanograms.

In the film pattern formation method according to the present invention, electrically conductive film patterns can be formed using the above-mentioned ink for forming wiring patterns. Thus, such electrically conductive film patterns are applied to various devices as wiring.

Figure 3:
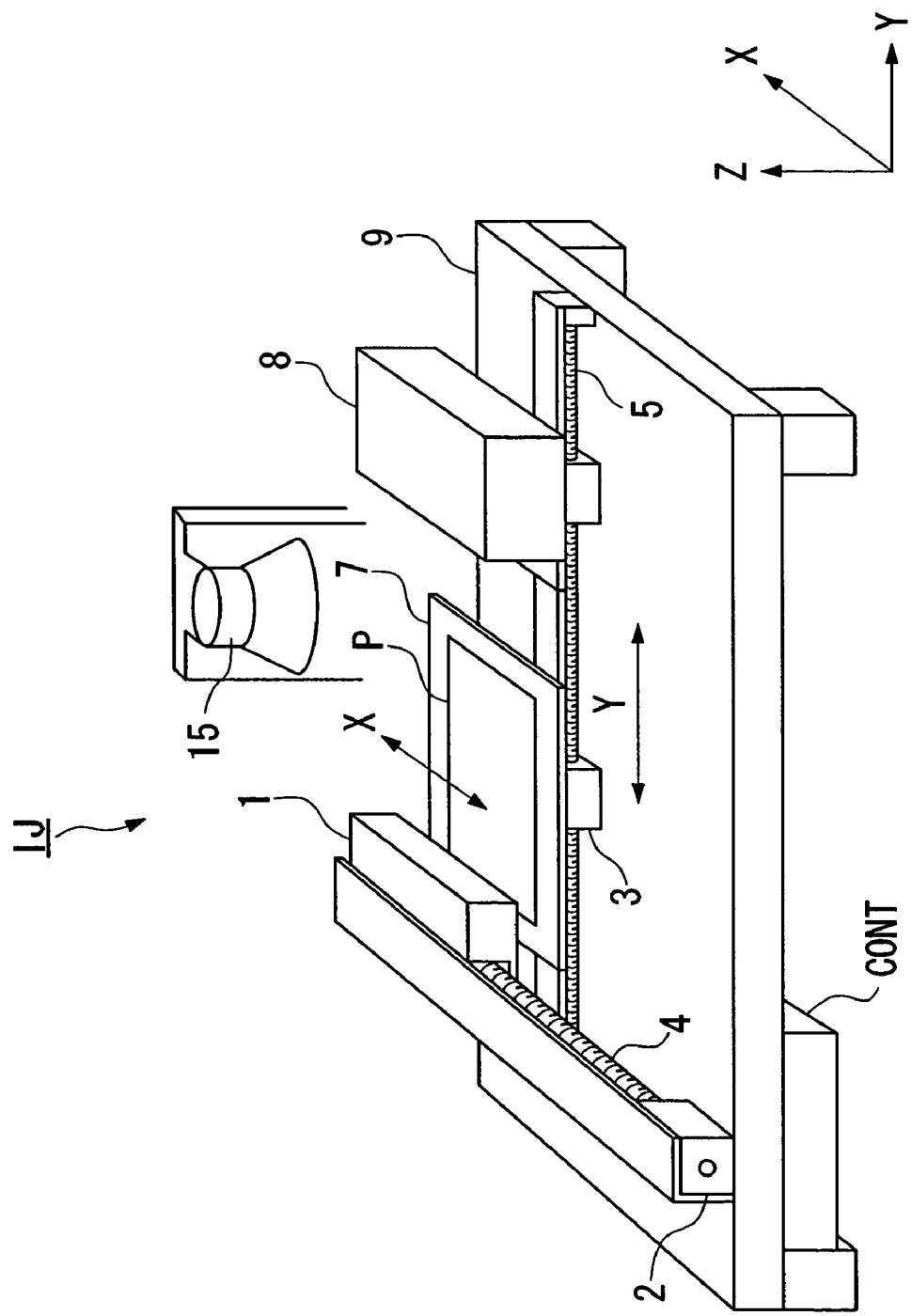
FIG. 3 is a schematic perspective view of a liquid drop ejection apparatus.

FIG. 3 is a perspective view showing the schematic construction of a liquid drop ejection apparatus (ink jet apparatus) IJ as an example of an apparatus used in the film pattern formation method according to the present invention.

The liquid drop ejection apparatus IJ includes a liquid drop ejection head 1, an X-axis direction drive shaft 4, a Y-axis direction guide shaft 5, a controller CONT, a stage 7, a cleaning mechanism 8, a base 9, and a heater 15.

The stage 7 supports a substrate P on which ink (a liquid material) is ejected by this liquid drop ejection apparatus IJ, and includes a clamping mechanism, which is not shown, that fixes the substrate P to a reference position.

The liquid drop ejection head 1 is a multi-nozzle type liquid drop ejection head having a plurality of ejection nozzles, and its longitudinal direction coincides with the X-axis direction. Each of a plurality of ejection nozzles is provided in the bottom face of the liquid drop ejection head 1 at regular intervals along the Y-axis direction. From the ejection nozzle of the liquid drop ejection head 1, ink containing the above-mentioned conductive particles is ejected to the substrate P supported by the stage 7.

The X-axis direction drive motor 2 is connected to the X-axis direction drive shaft 4. The X-axis direction drive motor 2 is a stepping motor and the like, and when an X-axis direction drive signal is supplied from the controller CONT, it rotates the X-axis direction drive shaft 4. When the X-axis direction drive shaft 4 is rotated, the liquid drop ejection head 1 moves in the X-axis direction.

The Y-axis direction guide shaft 5 is fixed so that it cannot move with reference to the base 9. The stage 7 includes a Y-axis direction drive motor 3. The Y-axis direction drive motor 3 is a stepping motor and the like, and when a Y-axis direction drive signal is supplied from the controller CONT, it moves the stage 7 in the Y-axis direction.

The controller CONT supplies a voltage for the control of ejecting liquid drops to the liquid drop ejection head 1. In addition, the controller CONT supplies a drive pulse signal controlling the movement of the liquid drop ejection head 1 in the X-axis direction to the X-axis direction drive motor 2, and supplies a drive pulse signal controlling the movement of the stage 7 in the Y-axis direction to the Y-axis direction drive motor 3.

The cleaning mechanism 8 cleans the liquid drop ejection head 1. The cleaning mechanism 8 is provided with a Y-axis direction drive motor, which is not shown. By the drive of this drive motor in the Y-axis direction, the cleaning mechanism moves along the Y-axis direction guide shaft 5. The movement of the cleaning mechanism 8 is also controlled by the controller CONT.

The heater 15 is a means for thermal treatment of the substrate P by lamp annealing, and evaporates and dries a solvent contained in a liquid material applied on the substrate P. The power-on and power-off of this heater 15 are also controlled by the controller CONT.

The liquid drop ejection apparatus IJ ejects a liquid drop to the substrate P while scanning the liquid drop ejection head 1 and stage 7 supporting the substrate P relatively with respect to each other. Here, let the X-axis direction be a scanning direction, and let the Y-axis direction, which is orthogonal to the X-axis direction, be a non-scanning direction, in the following explanation. Therefore, the ejection nozzles of the liquid drop ejection head 1 are provided while being arranged in regular intervals in the Y-axis direction which is the non-scanning direction. It should be understood that, although in FIG. 3 the liquid drop ejection head 1 is shown as being arranged at right angles to the direction in which the substrate P is shifted, it would also be acceptable to adjust the angle of the liquid drop ejection head 1, so as to make it intersect the direction of shifting of the substrate P at any desired angle.

If this is done, by adjusting the angle of the liquid drop ejection head 1 relative to the direction in which the substrate P is shifted, it is possible to adjust the pitch between the nozzles as desired. Furthermore, it would also be acceptable to arrange it so that the distance between the substrate P and the nozzle surface can be adjusted as desired.

Figure 4:
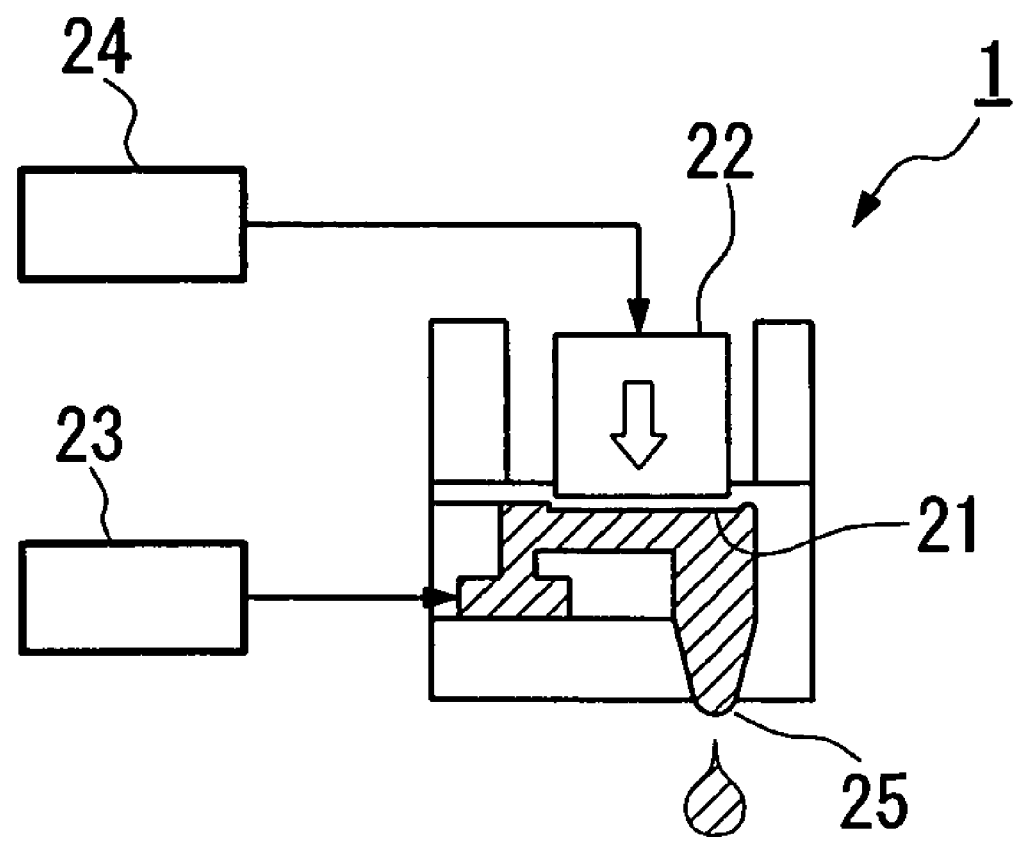
FIG. 4 is a diagram for explaining an ejection principle of a liquid material by a piezo system.

FIG. 4 is a diagram for explaining an ejection principle of a liquid material by a piezoelectric system.

In FIG. 4, a piezo-electric element 22 is provided adjacent to a liquid chamber 21 containing a liquid material (ink for wiring patterns, function liquid). The liquid material is supplied to the liquid chamber 21 via liquid material supply system 23 including a material tank containing the liquid material.

The piezo-electric element 22 is connected to a drive circuit 24. By applying a voltage to the piezo-electric element 22 via this drive circuit 24 to deform the piezo-electric element 22, the liquid chamber 21 deforms for the liquid material to be ejected from a nozzle 25. In this case, a distortion amount of the piezo-electric element 22 is controlled by changing the value of the applied voltage. In addition, the distortion speed of the piezo-electric element 22 is controlled by changing the frequency of the applied voltage. Since the piezo method is one in which heat is not applied to the functional liquid, it has the beneficial aspect that the composition of the material is not affected.

Next, with reference to FIG. 5, a method of forming conductive film wiring on a substrate will be explained as an example of embodiments of the method of forming a wiring pattern according to the present invention.

The film pattern formation method according to this embodiments disposes the above-mentioned ink for wiring patterns (wiring pattern formation material) on a substrate to form an electrically conductive film pattern for the wiring on the substrate, and generally includes a bank formation step, a residue treatment step, a liquid repellency-imparting step, a material disposing and intermediate drying step, and a baking step.

Hereafter, each step will be explained in detail.

(Bank Formation Step)

Figure 5A:
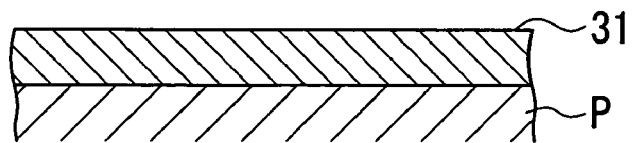
FIGS. 5A–E illustrate steps for forming a wiring pattern.

The banks function as partition members, and the formation of these banks may be performed using any suitable method, such as a photolithography method or a printing method or the like. For example, if a photolithography method is used, material 31 which is to be utilized for forming the banks is applied by a predetermined method such as spin coating, spray coating, roll coating, dye coating, dip coating, or the like, as shown in FIG. 5A, on the substrate P to a height which corresponds to the desired height of the banks, and a resist layer is applied over that layer. Masking is performed in correspondence to the desired pattern of banks (the wiring pattern), and then, by exposing and developing the resist, a pattern of resist which corresponds to the desired pattern for the banks is left remaining. Finally the bank material is removed by etching, except for regions which are covered by the resist layer. Moreover, it would also be acceptable to form two or more layers of banks (projections) by making the lower layer from an inorganic material and the upper layer from an organic material.

Figure 5B:
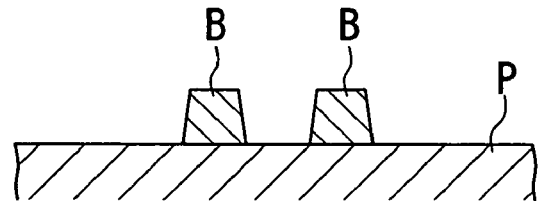

Thereby, as shown in FIG. 5B, banks B and B are provided in a protruding manner, for example, with a width of 10 to 15 μm so that the banks may surround a region in which a wiring pattern is to be formed.

Furthermore, in this example, a linear area is formed by the bank, and a wide-width region width of which is wider than the other region is formed at a predetermined position along the longitudinal direction of this linear area, as shown in FIG. 1 mentioned above.

In addition, although HMDS treatment (method for applying $(CH_3)_3SiNHSi(CH_3)_3$ in a vapor state) is given to the substrate P as a surface modification treatment before organic material coating, this treatment is omitted in FIG. 5.

(Residue Treatment Step<Liquid-Affinity Imparting Step>)

Next, in order to remove the resist (organic substance) residue between banks at the time of the bank formation, residue treatment is performed on the substrate P.

As the residue treatment, it is possible to select ultraviolet light (UV) irradiation processing in which an affinity with liquid is imparted by irradiation with ultraviolet light, or $O_2$ plasma processing in which oxygen is used as the process gas at ambient atmospheric pressure, or the like.

Specifically, this is performed by emitting oxygen plasma from a plasma ignition electrode to the substrate P. As an example of conditions of such $O_2$ plasma processing, for example, the plasma power may be 50 to 1000 W, the flow rate of the oxygen gas may be from 50 to 100 mL/min, the relative transfer speed of the substrate P with respect to the plasma discharge electrode may be 0.5 to 10 mm/sec, and the temperature of the substrate may be 70 to 90° C.

If the substrate is a glass substrate, although its surface is endowed with affinity with liquid with respect to the wiring pattern formation material, it is possible to enhance the affinity with liquid of the surface of the substrate by subjecting it to $O_2$ plasma processing or ultraviolet light irradiation processing, as the residual treatment in this embodiment.

(Liquid Repellency-Imparting Step)

Next, a liquid repellency-imparting step is performed upon the banks B to impart a liquid repellency to their surfaces.

As such a liquid repellency-imparting step, it is possible to utilize a plasma processing method (a $CF_4$ plasma processing method) in which tetrafluoromethane is employed as the process gas at ambient atmospheric pressure. As conditions of such $CF_4$ plasma processing, for example, the plasma power may be 50 to 1000 W, the flow rate of the methane tetrafluoride gas may be from 50 to 100 mL/min, the relative transfer speed of the substrate P with respect to the plasma discharge electrode may be 0.5 to 1020 mm/sec, and the temperature of the substrate may be 70 to 90° C.

It should be understood that the process gas should not be considered as being limited to tetrafluoride methane (carbon tetrafluoride); alternatively, it would be possible to utilize some other fluorocarbon gas.

By performing this type of liquid repellency-imparting step, fluorine-containing groups are introduced into the resin which constitutes the banks B and B, and thereby a high liquid repellency is imparted. It should be understood that, although it would be acceptable to perform the $O_2$ plasma processing which serves as the above-described liquid affinity imparting treatment before forming the banks B, it is more preferable to perform the $O_2$ plasma processing after forming the banks B, since the banks B, if pre-processing by $O_2$ plasma is performed, can be easily fluorinated (can be easily made liquid repelling).

It should be understood that, the liquid repellency-imparting treatment to which the banks B and B are subjected may more or less affect the surface of the substrate P between the banks B and B which have previously been subjected to liquid affinity imparting treatment, in particular if the substrate P is glass or the like, since introduction of fluorine-containing groups caused by the liquid repellency-imparting treatment is absent, no damage is entailed to the affinity with liquid of the substrate P, in other words to its wettability.

Furthermore, with regard to the banks B and B, it would also be acceptable to curtail the liquid repellency-imparting treatment thereof by making the banks B and B from a material which has a liquid repellency (for example a material which contains fluorine groups).

(Material Disposing Step and Intermediate Drying Step)

Next, a wiring pattern formation material is disposed in an area partitioned by the banks B and B, i.e., between the banks B and B (groove defined by the banks) on the substrate P by using the liquid drop ejecting method with the liquid drop ejection apparatus IJ shown in FIG. 3 which has been described above. In this example, the dispersion liquid in which electrically conductive particles are dispersed in a solvent (dispersion medium) is ejected as the ink for wiring patterns (function liquid). The electrically conductive particles which are used herein, in addition to being metallic particles which include any of gold, silver, copper, palladium, or nickel or the like, may also be made from an electrically conductive polymer or a superconducting material or the like.

Figure 5C:
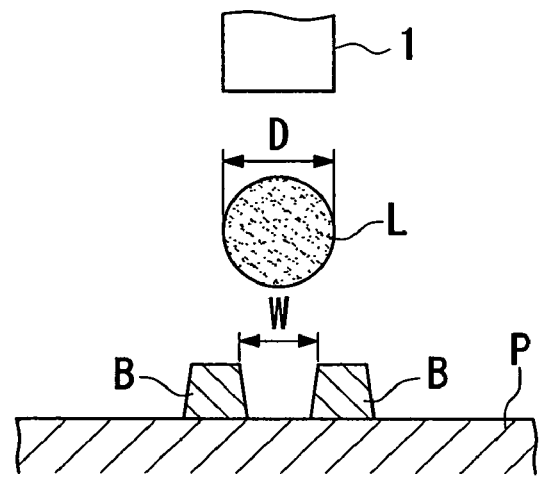

That is, in the material disposing step, as shown in FIG. 5C, a liquid material L containing a wiring pattern formation material is ejected from the liquid ejection head 1 as a liquid drop to dispose the liquid drop between the banks B and B on the substrate P. The conditions for ejecting liquid drops are, for example, a weight of the ink of 4 to 7 ng/dot and an ink speed (ejection speed) of 5 to 7 m/sec.

Since the area in which liquid material is to be disposed is partitioned by the banks B and B, the liquid material L is prevented from spreading on the substrate P.

Figure 5D:
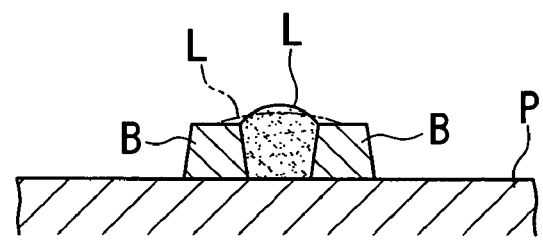
Figure 5E:
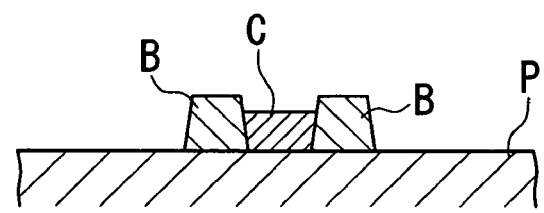

Furthermore, as shown in FIG. 5C, if the distance W between adjacent banks B and B are smaller than the diameter D of the liquid drop (e.g., the diameter D of the liquid drop is larger than the distance between the banks B and B), even though a part of the liquid drop is placed on the banks B and B, the liquid material L flows into the banks B and B due to the capillary phenomenon and the like, as shown in double-dashed line in FIG. 5D. In this example, since the banks B and B are endowed with liquid repellency, it is assured that the liquid material is repelled by the banks B and B and flows therebetween.

Yet furthermore, since the surface of the substrate P is endowed with affinity with liquid, the liquid material L which is flowed into the partitioned area will spread evenly within the area. Therefore, a coated film having a width W which is smaller than the diameter D of the ejected liquid drop can be formed.

Furthermore, in this example, as shown in FIGS. 1 and 2, since the landing spacing between liquid drops is set to a spacing with which liquid drops connect together in the linear area A after landing, and the distance between the position at which a liquid drops land at the end of the linear area A and the end of the linear area A is set to equal to or less than a half of a spacing between the liquid drops. Therefore, it is assured that the liquid drops will spread to the ends of the linear area A, and the functional liquid L is disposed within the linear area A without gaps.

(Intermediate Drying Step)

After a liquid drop has been disposed on the substrate P, according to requirements, a drying step is performed in order to remove the dispersion medium in this liquid drop, and in order to ensure a layer of desired thickness is formed. Such a drying step may be performed by, for example, a conventional method of heating up the substrate P with a hot plate, an electric furnace, or the like; or alternatively lamp annealing may also be employed.

The light source which is used for such lamp annealing is not to be considered as being particularly limited, but it may be an infrared lamp, a xenon lamp, a YAG laser, an argon laser, a carbon dioxide gas laser, or an excimer laser such as a XeF, XeCl, XeBr, KrF, KrCl, ArF, or ArCl laser or the like. These light sources are generally utilized in the output power range from 10 W to 5000 W, but, in this embodiment of the present invention, an output power of from 100 W to 1000 W is considered to be sufficient.

(Baking Step)

After the drop ejection step, a complete removal of the dispersion medium is required in order to ensure good electrical contact between the particles. Furthermore, if a coating material such as an organic material or the like has been coated on the surface of the electrically conductive particles in order to enhance the dispersibility, it is also necessary to remove this coating material. For this, thermal treatment and/or photo treatment is performed to the substrate after the ejection step.

Such thermal treatment and/or photo treatment is normally performed in the ambient atmosphere, but, according to requirements, it could be performed in an inert gas atmosphere, such as nitrogen, argon, helium or the like. The process temperature for this thermal treatment and/or photo treatment is set suitably, in consideration of the boiling point (the vapor pressure) of the dispersion medium, the type and pressure of the gas atmosphere, thermal behavior of the particles such as their dispersibility and oxidizability and so on, the presence or absence of any coating material and the amount thereof, the heat resistant temperature of the substrate itself, and so on.

For example, in order to remove a coating material which consists of an organic material, it is necessary to perform baking at about 300° C. In this example, the banks B and the dried liquid material may have been coated with low-melting glass and the like beforehand.

Yet further, if a substrate made of plastic or the like is utilized, it is preferable to perform baking above room temperature but at less than or equal to 100° C.

The electrical contact between the particles in the dried layer after the ejection step is ensured by the above-described process, and, it is converted into an electrically conductive layer (i.e., a wiring pattern C), as shown in FIG. 5.

As explained above, in the film pattern formation method according to the present invention, since the spacing between landed liquid drops and the landing position at the end of the linear area are determined properly, it is assured that the liquid drops spread to ends of the linear area and that the functional liquids are disposed in the linear area without gaps.

Accordingly, file film patterns can be formed in a stable manner using the film pattern formation method according to the present invention.

Second Embodiment

In the following, a second embodiment of the present invention will be explained with reference to the drawings.

Figure 6:
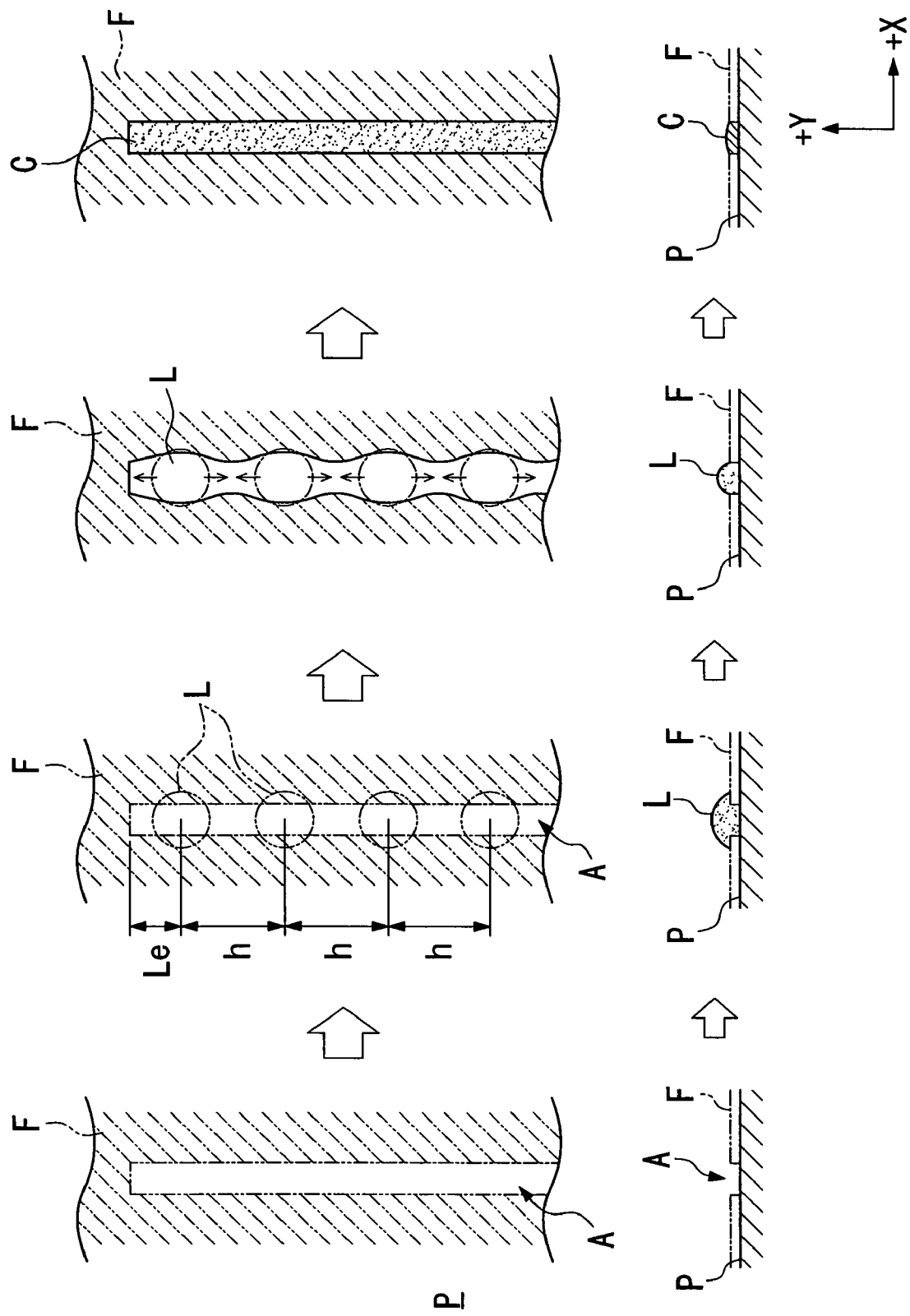
FIG. 6 is a diagram schematically illustrating a film pattern formation method according to the present invention.

FIG. 6 is a diagram schematically illustrating a film pattern formation method according to the present invention.

The film pattern formation method according to the present invention includes a liquid repelling layer forming step for forming a liquid repelling layer F in a desired pattern having repellency to functional liquid on a substrate P, and a material disposing step for disposing functional liquid L to a linear area A partitioned by the liquid repelling layer F.

As methods for forming the liquid repelling layer F, it is possible to use, for example, a method for forming a self assembled layer on a substrate, plasma processing (plasma polymerization), eutectoid plating, and a method for imparting liquid repellency with gold thiol. For example, a liquid repelling layer F in a desired pattern can be formed on a substrate by imparting liquid repellency to the entire surface of the substrate, and then reducing the liquid repellency in an region on which a film pattern is to be formed (affinity-imparting treatment).

Alternatively, a liquid repelling layer F in a desired pattern may be formed on a substrate by imparting liquid repellency using a mask having the desired pattern.

In the present invention, the contact angle on the surface of the liquid repelling layer F is larger than the contact angle on the surface of the substrate P within the linear area A, and the difference therebetween may be 50° or more, for example.

In the film pattern formation method according to the present invention, functional liquid L is disposed in the area A partitioned by the liquid repelling layer F, and a film pattern C is formed on the substrate P after the functional liquid L is dried, for example. Upon disposing the functional liquid L, a function film is disposed according to the pattern of the liquid repelling layer F due to the reason that the functional liquid L is repelled by the liquid repelling layer F. In this case, since the shape of the film patterns C are defined by the liquid repelling layer F, further progress in the fineness of the wiring and the further miniaturization of a film pattern C can be attained by designing the shape of liquid repelling layer F appropriately, for example, by reducing the width of the linear area A.

In the material disposing step, liquid drops of the functional liquid L are repeatedly made to land on the substrate P with a predetermined pitch (the landing spacing "h"). As a method for disposing the functional liquid L, a liquid drop ejection method, a so-called ink jet method, is used, for example. The liquid drop ejection method has an advantage over other coating methods, such as spin coating, in that the liquid material is efficiently consumed, and the amount and positions of the functional liquid to be disposed on the substrate can be easily controlled.

In the liquid drop ejection method, liquid drops are repeatedly made to land on the substrate P while shifting a liquid drop ejection head and the substrate P relative to each other. Since the relative shifting speed is usually constant, the landing spacing "h" (i.e., ejection pitch) of the liquid drops with respect to the direction of the above-mentioned relative shifting (y direction in FIG. 1) becomes constant. An apparatus for ejecting liquid drops for the liquid drop ejection method will be described later in detail.

In the present invention, the landing spacing "h" is set to a spacing with which liquid drops connect together in the linear area A after landing, and is determined properly according to the properties of the functional liquid L (e.g., viscosity), the amount of the liquid drops, the width of the linear area, surface characteristics of the liquid repelling layer F and the substrate P or the like. In this case, a liquid drop which landed on the substrate P will spread on the linear area due to phenomena such as capillary phenomenon, and connect to other liquid drops. A plurality of liquid drops connect together, and the functional liquid L is filled within the linear area A.

Furthermore, in the material disposing step, the distance "Le" between an end of the linear area A and the position at which a liquid drop which landed closest to the end of the linear area A is set to equal to or less than a half of the landing spacing "h" between the liquid drops.

As described above, since the landing spacing "h" is set to a spacing with which liquid drops connect together in the linear area A after landing, in the linear area A, liquid drop will spread by at least a half of the landing spacing "h" in one direction (in the direction along which liquid drops are aligned, for example, +Y direction shown in FIG. 1). Therefore, since the distance "Le" between an end of the linear area A and the position at which a liquid drop which landed closest to the end of the linear area A is equal to or less than a half of the landing spacing "h", it is assured that the liquid drop which landed closest to the end will spread to the end of the linear area A. Since a plurality of liquid drops connect together in the linear area A, and moreover, the liquid drops spread to the ends of the linear area A, the functional liquid L is disposed within the linear area A without gaps.

Figure 7:
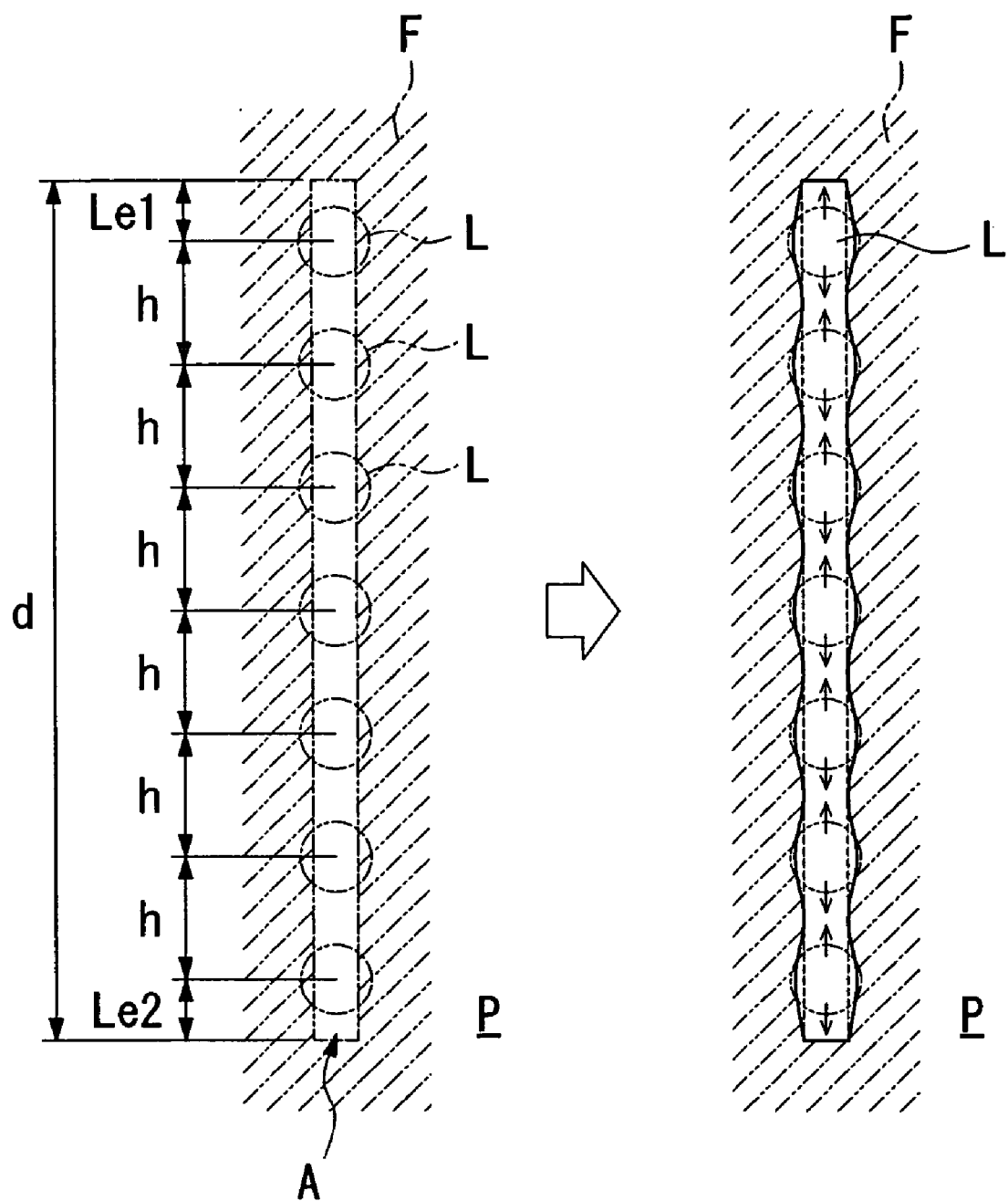
FIG. 7 is a diagram illustrating the relationship between the length of the linear area and the landing positions at ends of the linear area.

As shown in FIG. 7, the distance "Le" between an end of the linear area A and the position at which a liquid drop which landed closest to the end of the linear area A is preferably y/2, where "d" is the length of the linear area A, "h" is the spacing between the liquid drops, and "y" is a remainder obtained by dividing "d" by "h".

For example, if "d" is 270 μm and "h" is 40 μm, the remainder "h" obtained by dividing "d" becomes 30 μm. In this case, since the distances "Le1" and "Le2" between an end of the linear area and the position at which a liquid drop closest to the end of the linear area A is landed is equal to or less than h/2 (=20 μm), the liquid drops will spread to the ends of the linear area A. Yet furthermore, if the distances "Le1" and "Le2" is y/2 (=15 μm), the distances "Le1" and "Le2" between an end of the linear area and the position at which a liquid drop closest to the end of the linear area A is landed become equal to each other at the both ends of the linear area A (Le1=Le2). Since liquid drops are evenly disposed at the longitudinal direction of linear area A, the functional liquid L is disposed more evenly within the linear area A.

It should be understood that although the linear area A with a uniform width is preferably used, the present invention is not limited to such a linear area. The width of linear area may be varied partially in the area or in the whole area.

Referring again to FIG. 6, as a substrate on which a wiring pattern is formed, it is possible to use various kinds of material, such as glass, quartz glass, a Si wafer, a plastic film, and a metal plate. Furthermore, as an under-layer on the surface of such a raw material substrate, it would also be possible to include a semiconductive layer, a metallic layer, a dielectric layer, an organic layer, or the like.

Furthermore, various materials may be used as the functional liquid L of the present invention and an ink for forming wiring patterns which contains electrically conductive particles is used, for example.

The ink for forming wiring patterns is made of a dispersion liquid in which electrically conductive particles are dispersed in a dispersion medium.

The electrically conductive particles, in addition to being metallic particles which include any of gold, silver, copper, palladium, or nickel or the like, or an oxide thereof, may also be made from an electrically conductive polymer or a superconducting material or the like.

A coating such as an organic material or the like may also be used on the surface of these electrically conductive particles, in order to enhance their dispersibility.

It is preferable for the diameter of the electrically conductive particles to be greater than or equal to 1 nm and less than or equal to 0.1 μm. If this diameter becomes greater than 0.1 μm, it may be possible that the nozzle of a liquid drop ejection head described later may be clogged. On the other hand, if this diameter is less than 1 nm, the ratio of the volume of the coating material to the volume of the electrically conductive particles becomes rather large, which results in excessive organic material in the resulting layer.

The dispersion medium is not to be considered as being particularly limited, provided that it is capable of dispersing the above-described electrically conductive particles, and provided that it does not cause agglomeration of the particles. For example, as possible polar compounds, other than water, there may be cited, for example, alcohols such as methanol, ethanol, propanol, butanol and the like; hydrocarbons such as n-heptane, n-octane, decane, tetradecane, toluene, xylene, cymene, durene, indene, dipentene, tetrahydronaphthalene, decahydronaphthalene, cyclohexylbenzene and the like; ethers such as ethylene glycol dimethyl ether, ethylene glycol diethyl ether, ethylene glycol methyl ethyl ether, diethylene glycol dimethyl ether, diethylene glycol methyl ethyl ether, diethylene glycol methylethyl ether, 1,2-dimethoxy ethane, bis-(2-methoxy ethyl)-ether, p-dioxane, and the like; or polar compounds such as propylene carbonate, γ-butylolactone, N-methyl-2-pyrolidone, dimethyl formamide, dimethyl sulfoxide, cyclohexanone or the like. Among these, from the point of view of dispersibility of the particles and stability of the dispersion liquid, and from the point of view of ease of application to the liquid drop ejection method, the use of water, alcohols, hydrocarbons, or ethers are preferable; and, as a more desirable dispersion medium, water or hydrocarbons are even more preferable.

It is preferable for the surface tension of the dispersion liquid of the above-described electrically conductive particles to be within the range of greater than or equal to 0.02 N/m and less than or equal to 0.07 N/m. When ejecting a liquid using a liquid drop ejection method, if the surface tension is less than 0.02 N/m, it becomes easy for deviations during ejection of the liquid drops to occur, since the wettability of the ink composition with respect to the surface of the nozzle is increased, while if the surface tension exceeds 0.07 N/m, it becomes difficult to control the ejection amount and the ejection timing, since the shape of the meniscus at the nozzle tip becomes unstable. In order thus to adjust the surface tension, it will be acceptable to add to the above-described dispersion liquid, in very small amount, within the range in which the contact angle with the substrate does not greatly decrease, a surface tension modifier such as a fluorine-containing, a silicon-containing, or a non-ionic material, or the like. A non-ionic surface tension modifier increases the wettability of the liquid to the substrate, and improves the quality of leveling of the resulting layer, and is a material which serves to prevent the generation of minute concavities and convexities in this layer. It will also be acceptable, according to requirements, to include an organic compound such as an alcohol, an ether, an ester, a ketone or the like in the above-described surface tension modifier.

It is preferable for the viscosity of the above-described dispersion liquid to be greater than or equal to 1 mPa·s and less than or equal to 50 mPa·s. When ejecting liquid drops of this liquid material using a liquid drop ejection method, if the viscosity is less than 1 mPa·s, the portion surrounding the vicinity of the nozzle can easily be contaminated by the ink as it flows out of the nozzle, while if the viscosity is greater than 50 mPa·s, it becomes difficult to eject liquid drops in a smooth manner, because the hole in the nozzle may be frequently clogged.

As a liquid drop ejection method, it is possible to suggest an electrification control method, a pressure vibration method, an electro-mechanical conversion method, an electro-thermal conversion method, an electrostatic expulsion method, or the like. An electrification control method is one in which an electric charge is imported to the material by a charging electrode, and the material is ejected from the nozzle while its direction of emission is controlled by a deflection electrode. Furthermore, a pressure vibration control method is one in which a high pressure of about 30 kg/cm$^2$ is applied to the material so that it is ejected from the tip of the nozzle, so that, if no control voltage is applied, the material is ejected from the nozzle in a straight line, while if a control voltage is applied, electrostatic repulsion is engendered between the various portions of the material, so that the material is scattered and is not ejected in a straight line from the nozzle. Yet furthermore, an electro-mechanical conversion control method is one which takes advantage of the characteristic that a piezo element (a piezo-electric element) deforms when it is subjected to a pulse type electrical signal, by applying a pressure by such a deformation of a piezo element, via a flexible member, to a space in which the material is stored, so that material is pushed out from this space to be ejected from the nozzle.

Even furthermore, an electro-thermal conversion method is one in which the material is heated up by a heater provided within a space in which it is stored, and is abruptly vaporized so that bubbles are generated therein, and then the material within this space is ejected therefrom due to the pressure of the bubbles. Finally, an electrostatic expulsion method is one in which a very small pressure is applied to the material within the space in which it is stored, so that a meniscus is created upon the material at a nozzle, and then, in this state, the material is ejected by subjecting it to electrostatic attraction. Furthermore, in addition to these, it is also possible to apply techniques such as a method which takes advantage of the change of viscosity of a liquid due to an electric field, or a method in which the liquid is caused to be ejected by an electric spark discharge, or the like. These liquid drop ejection methods do not waste any material; rather, they have the advantageous feature that they can dispose an appropriate and desired amount of liquid material in the desired position. It should be understood that the amount of the liquid material (i.e., fluid) in a single drop of the functional liquid which is ejected by any one of these liquid drop ejection methods is, for example, from 1 to 300 nanograms.

In the film pattern formation method according to the present invention, electrically conductive film patterns can be formed using the above-mentioned ink for forming wiring patterns. Thus, such electrically conductive film patterns are applied to various devices as wiring.

Third Embodiment

Next, with reference to FIGS. 8A–E, a method of forming conductive film wiring on a substrate will be explained as an example of embodiments of the method of forming a wiring pattern according to the present invention.

The film pattern formation method according to this embodiments disposes the above-mentioned ink for wiring patterns (wiring pattern formation material) on a substrate to form an electrically conductive film pattern for the wiring on the substrate, and generally includes a surface treatment step (liquid repelling layer forming step), a material disposing step and intermediate drying step, and a thermal treatment/photo treatment step.

Hereinafter, each step will be explained in detail.

(Surface Treatment Step)

The surface treatment step is classified broadly into the liquid-repelling treatment step which imparts liquid-repellency to a substrate surface, and the liquid-affinity treatment step which imparts to affinity with liquid to the substrate surface to which has been imparted liquid-repellency.

In the surface treatment step, the surface of the substrate on which electrically conductive film wiring is formed is processed to be liquid-repellent to a liquid material. More specifically, surface treatment is performed so as to bring its predetermined contact angle with respect to functional liquid containing electrically conductive particles to greater than or equal to 60°, and preferably greater than or equal to 90° and less than or equal to 110°.

As a method for controlling liquid repellency (wettability) of the surface, a method for forming a self assembled layer or plasma treatment may be used, for example.

As a method of forming such a self assembled layer on the surface of the substrate which can create an electrically conductive layer wiring pattern, a self assembled layer is formed from an organic molecular film or the like.

The organic molecular film for processing the substrate surface includes: a functional group which can be combined with the substrate; on its other side, a functional group which modifies the quality of (i.e., controls the surface energy of) the surface of the substrate, i.e., a group having an affinity with liquid or a liquid repelling group positioned at the opposite side of the substrate-combining functional group; and a carbon straight chain which connects together these functional groups, or a carbon chain which branches off from one portion thereof; and it constitutes a molecular film, for example a monomolecular film, which is of the same constitution as the substrate, and is combined with the substrate.

As used herein, the term "self assembled layer" refers to a layer which consists of connecting functional groups which can react with the constituent atoms of the under-layer of the substrate or the like and straight-chain molecules, and which is made by orienting a compound which has extremely high orientability due to interaction of its straight-chain molecules. Since such a self assembled layer is made by orienting mono-molecules, it can be made extremely thin, and moreover it is very uniform film at a molecular level. In other words, since all its molecules are positioned upon the same film surface, it has a very uniform film surface, as well as being able to impart an excellent liquid repellency or affinity with liquid.

As the above-described compound endowed with high orientability, by using, for example, a fluoro alkyl silane, a self assembled film is formed with the compounds being oriented so that the fluoro alkyl groups are positioned on the surface of the film, and so that a uniform liquid repellency is imparted to the surface of the film.

As compounds for forming this type of self assembled layer, there may be suggested fluoro alkyl silanes (hereinafter referred to as "FASs") such as hepta-deca-fluoro-1,1,2,2-tetra-hydro-decyl-tri-ethoxy-silane, hepta-deca-fluoro-1,1,2,2-tetra-hydro-decyl-tri-methoxy-silane, hepta-deca-fluoro-1,1,2,2-tetra-hydro-decyl-tri-chloro-silane, tri-deca-fluoro-1,1,2,2-tetra-hydro-octyl-tri-ethoxy-silane, tri-deca-fluoro-1,1,2,2-tetra-hydro-octyl-tri-methoxy-silane, tri-deca-fluoro-1,1,2,2-tetra-hydro-octyl-tri-chloro-silane, tri-fluoro-propyl-tri-methoxy-silane, or the like. These compounds may be used alone, or in a mixture of two or more thereof.

It should be understood that, by using a FAS, it is possible to obtain both good adhesion to the substrate and also the desired liquid repellency.

A FAS is generally expressed by the structural formula: $R_nSiX_{(4-n)}$, where n is an integer between 1 and 3 inclusive, and X is a methoxy group, an ethoxy group, a halogen atom or other hydrolytic group or the like. Furthermore, R is a fluoro alkyl group having a structure of $(CF_3)(CF_2)_x(CH_2)_y$ (where x is an integer between 0 and 10 inclusive, and y is an integer between 0 and 4 inclusive), and, if a plurality of such Rs and/or Xs are combined with Si, it will also be acceptable either for the Rs and/or the Xs to be the same as one another, or alternatively for them to differ from one another. The hydrolytic groups which are expressed as X make a silanol by hydrolysis, and react with hydroxyl groups in the under-layer of the substrate (glass or silicon) by forming a siloxane bond. On the other hand, since R includes a fluoro group such as $(CF_2)$ or the like upon its surface, it modifies the under surface of the substrate into a non wetting surface (whose surface energy is low).

The self assembled layer consisting of an organic molecular film and the like is formed on the substrate when the above-mentioned raw material compound and the substrate are contained in the same sealed container and left for two to three days at room temperature. It should be understood that, although in the above the formation of a self assembled layer from the gas phase is used, such a layer could also be formed from a liquid phase. For example, the self assembled layer may be formed on the substrate by soaking the substrate in a solution which contains the source compound, cleaning it, and drying it.

In addition, it is desirable to perform pretreatment on the surface of the substrate by irradiating with ultraviolet light, or by cleaning it by using a solvent before forming the self assembled layer.

On the other hand, with a plasma processing method, plasma irradiation is performed on the substrate at normal pressure or in a vacuum. The type of gas which is utilized for such plasma processing may be selected in consideration of the surface material of the substrate P upon which it is required to form conductive film wiring, and the like. As such a process gas, for example, it is possible to utilize tetrafluoro methane, perfluorohexane, perfluorodecane, or the like.

It should be understood that the processing for imparting a liquid repellency to the surface of the substrate P may also be performed by adhering a film which is endowed with the desired liquid repellency, for example a polyimide film which has been processed with tetrafluoro-ethylene or the like, to the surface of the substrate. Furthermore, it would also be acceptable to utilize such a polyimide film of which the liquid repellency is high as the substrate, just as it is.

Figure 8A:
FIGS. 8A–E illustrate steps for forming a wiring pattern.

Thus, by performing the method of forming such a self assembled layer or plasma processing, the surface of the substrate P is imparted liquid-repellency as shown in FIG. 8A.

Next, the wettability of a substrate surface is controlled by reducing the liquid-repellency of an application region to apply a wiring pattern formation material to where a wiring pattern should be formed (application region), and imparting liquid-affinity (liquid-affinity treatment).

In the following, the liquid affinity imparting treatment will be explained in detail.

Figure 8B:
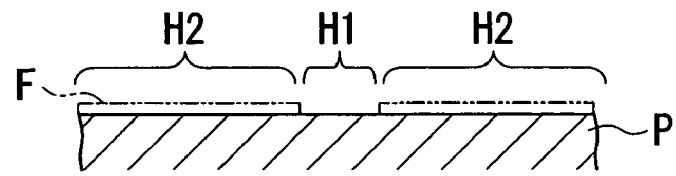

As the liquid-affinity imparting treatment, irradiation with ultraviolet light at the wavelength of 170 to 400 nm can be used. At this time, by irradiating ultraviolet light by using a mask according to a wiring pattern, it is possible to selectively reform only a region on which wiring is to be formed on a surface of the substrate to which has been imparted liquid-repellency, to reduce its liquid-repellency and impart the region affinity with liquid. That is, by performing the above-mentioned liquid-repelling treatment and liquid-affinity treatment, as shown in FIG. 8B, an application region H1, which was imparted liquid-affinity, in the position in which a wiring pattern is to be formed, and a liquid-repellent area H2 surrounding the application region H1 are formed on the substrate P.

In addition, although it is possible to adjust the extent of reduction of liquid-repellency by the irradiation time of ultraviolet radiation, it is also possible to adjust the extent by the intensity and wavelength of ultraviolet radiation, in combination with thermal treatment (heating), and the like. For example, ultraviolet light is irradiated in the conditions under which the contact angle at the application region H1 becomes 10° or less so that the difference between the contact angle at the application region H1 with respect to the liquid material containing electrically conductive particles and the contact angle at the liquid-repellent area H2 becomes 50° or less.

As other methods for liquid affinity imparting treatment, plasma processing using oxygen as process gas may be performed. Specifically, this is performed by emitting oxygen plasma from a plasma ignition electrode to the substrate P. As an example of conditions of such $O_2$ plasma processing, for example, the plasma power may be 50 to 1000 W, the flow rate of the oxygen gas may be from 50 to 100 mL/min, the relative transfer speed of the substrate P with respect to the plasma discharge electrode may be 0.5 to 10 mm/sec, and the temperature of the substrate may be 70 to 90° C.

In this case, ultraviolet light is irradiated so that a contact angle of the application region H1 with respect to the liquid material containing electrically conductive particles may become 10° or less by extending plasma processing time by reducing transfer speed of the substrate P, for example.

Furthermore, it is also possible to adopt a treatment, which exposes a substrate to an ozone atmosphere, as another example of liquid-affinity treatment.

In the surface treatment step described above, the liquid repelling layer F in a desired pattern which is imparted liquid repellency to the wiring pattern formation material has been formed on the substrate P.

(Material Disposing Step and Intermediate Drying Step)

Next, a wiring pattern formation material is disposed in an area which is partitioned by the liquid repelling layer F on the substrate P by using the liquid drop ejecting method with the liquid drop ejection apparatus IJ shown in FIG. 3 which has been described above.

In this example, the dispersion liquid in which electrically conductive particles are dispersed in a solvent (dispersion medium) is ejected as the ink for wiring patterns (function liquid). The electrically conductive particles which are used herein, in addition to being metallic particles which include any of gold, silver, copper, palladium, or nickel or the like, may also be made from an electrically conductive polymer or a superconducting material or the like.

Figure 8C:
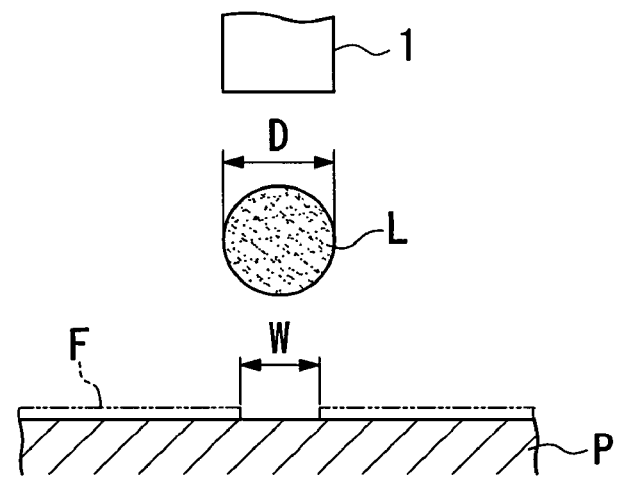

That is, in the material disposing step, as shown in FIG. 8C, a liquid material L containing a wiring pattern formation material is ejected from the liquid ejection head 1 as a liquid drop to dispose the liquid drop in the area A partitioned by the liquid repelling layer F (the linear area A shown in FIG. 6 and the application region H1 shown in FIG. 8B) on the substrate P. The conditions for ejecting liquid drops are, for example, a weight of the ink of 4 to 7 ng/dot and an ink speed (ejection speed) of 5 to 7 m/sec.

The liquid material L is repelled by the liquid repelling layer F, and is disposed in area partitioned by the liquid repelling layer F.

Figure 8D:
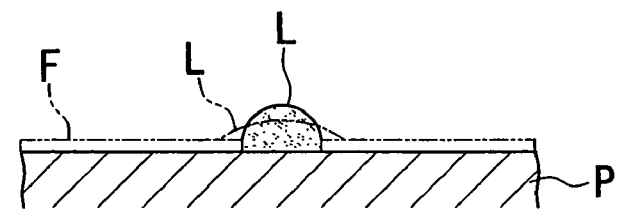

Furthermore, as shown in FIG. 8C, if the width W of the area partitioned by the liquid repelling layer F is smaller than the diameter D of the liquid drop (e.g., the diameter D of the liquid drop is larger than width W of the area partitioned by the liquid repelling layer F), even though a part of the liquid drop is placed on the liquid repelling layer F, the liquid material L flows into the area partitioned by the liquid repelling layer F due to the capillary phenomenon and the like, as shown in double-dashed line in FIG. 8D.

Yet furthermore, since the surface of the substrate P is endowed with affinity with liquid, the liquid material L which is flowed into the partitioned area will spread evenly within the area. Therefore, a coated film having a width W which is smaller than the diameter D of the ejected liquid drop can be formed.

Furthermore, in this example, as shown in FIGS. 6 and 7, since the landing spacing between liquid drops is set to a spacing with which liquid drops connect together in the linear area A after landing, and the distance between the position at which a liquid drops land at the end of the linear area A and the end of the linear area A is set to equal to or less than a half of a spacing between the liquid drops. Therefore, it is assured that the liquid drops will spread to the ends of the linear area A, and the functional liquid L is disposed within the linear area A without gaps.

(Thermal Treatment/Photo Treatment Step)

Next, in the thermal treatment/photo treatment step, the dispersion medium in the liquid drop or coating agent contained which has been disposed on the substrate is removed. That is, the dispersion medium in the liquid material for forming electrically conductive films which has been disposed on the substrate is required to be completely removed, in order to ensure good electrical contact between the particles. Furthermore, if a coating material such as an organic material or the like has been coated on the surface of the electrically conductive particles in order to enhance the dispersibility, it is also necessary to remove this coating material.

Such thermal treatment and/or photo treatment is normally performed in the ambient atmosphere, but, according to requirements, it could be performed in an inert gas atmosphere, such as nitrogen, argon, helium or the like. The process temperature for this thermal treatment and/or photo treatment is set suitably, in consideration of the boiling point (the vapor pressure) of the dispersion medium, the type and pressure of the gas atmosphere, thermal behavior of the particles such as their dispersibility and oxidizability and so on, the presence or absence of any coating material and the amount thereof, the heat resistant temperature of the substrate itself, and so on.

For example, in order to remove a coating material which consists of an organic material, it is necessary to perform baking at about 300° C. Yet further, if a substrate made of plastic or the like is utilized, it is preferable to perform baking above room temperature but at less than or equal to 100° C.

The thermal treatment and/or photo treatment may be performed by using lamp annealing in addition to typical heat-treatment using heating means such as a hot plate and an electric furnace. The light source which is used for such lamp annealing is not to be considered as being particularly limited, but it may be an infrared lamp, a xenon lamp, a YAG laser, an argon laser, a carbon dioxide gas laser, or an excimer laser such as a XeF, XeCl, XeBr, KrF, KrCl, ArF, or ArCl laser or the like. These light sources are generally utilized in the output power range from 10 W to 5000 W, but, in this embodiment of the present invention, an output power of from 100 W to 1000 W is considered to be sufficient.

Figure 8E:
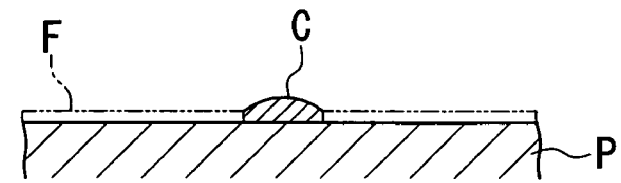

The electrical contact between the particles in the applied film on the substrate is ensured by the above-mentioned thermal treatment and/or photo treatment, and, the applied film is converted into an electrically conductive layer (wiring pattern C), as shown in FIG. 8E.

As explained above, in the film pattern formation method according to the present invention, since the spacing between landed liquid drops and the landing position at the end of the linear area are determined properly, it is assured that the liquid drops spread to ends of the linear area and that the functional liquids are disposed in the linear area without gaps.

Accordingly, file film patterns can be formed in a stable manner using the film pattern formation method according to the present invention.

Next, as an example of an electro-optical device according to the present invention, a liquid crystal display device will be explained. A TFT active-matrix display device will be described as one type of a liquid crystal display device.

Figure 9:
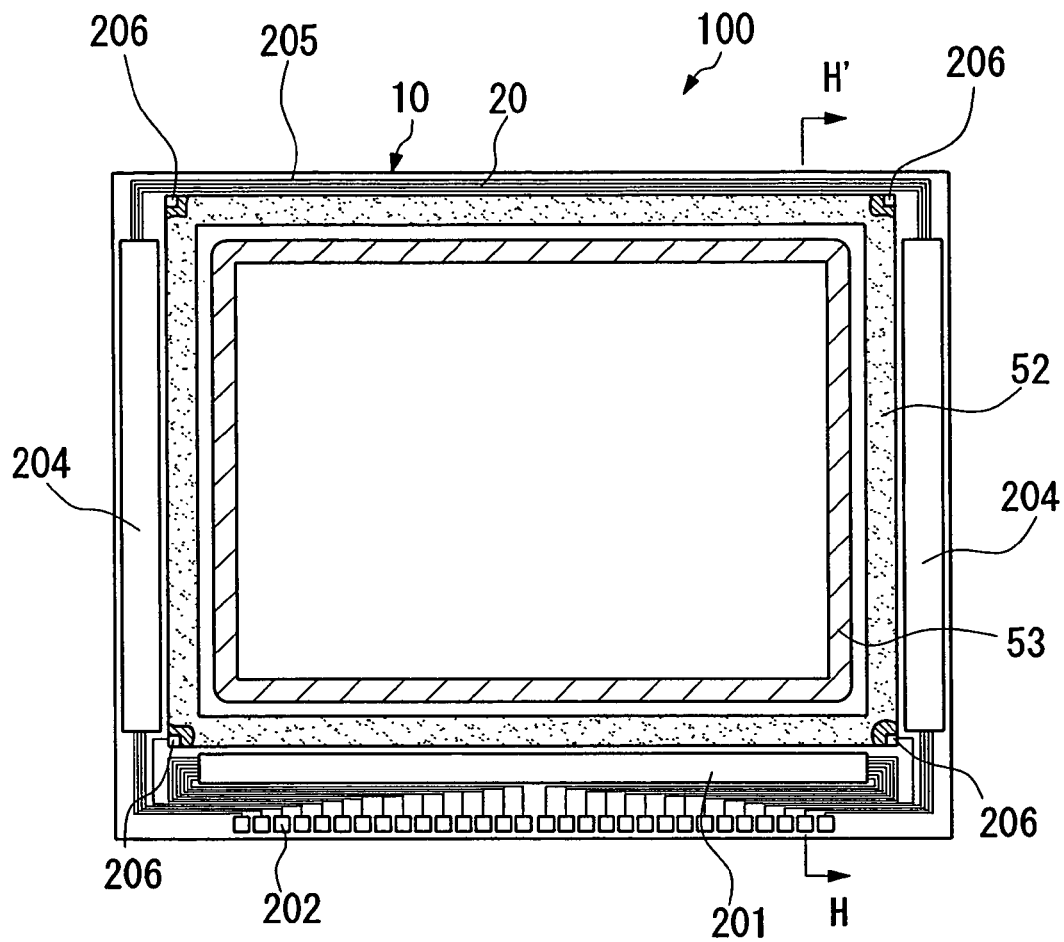
FIG. 9 is a plan view of a liquid crystal display device as viewed from an opposing substrate side.
Figure 10:
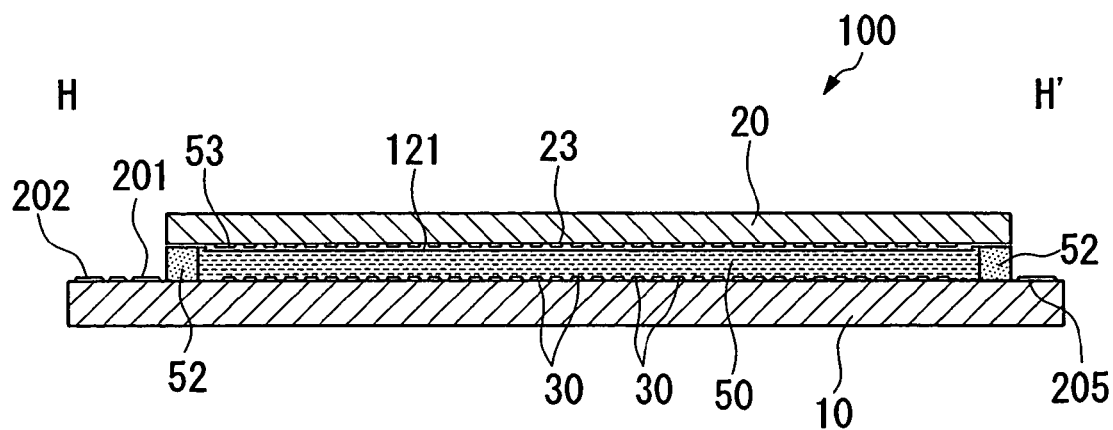
FIG. 10 is a sectional view taken along the line H–H' in FIG. 9.
Figure 11:
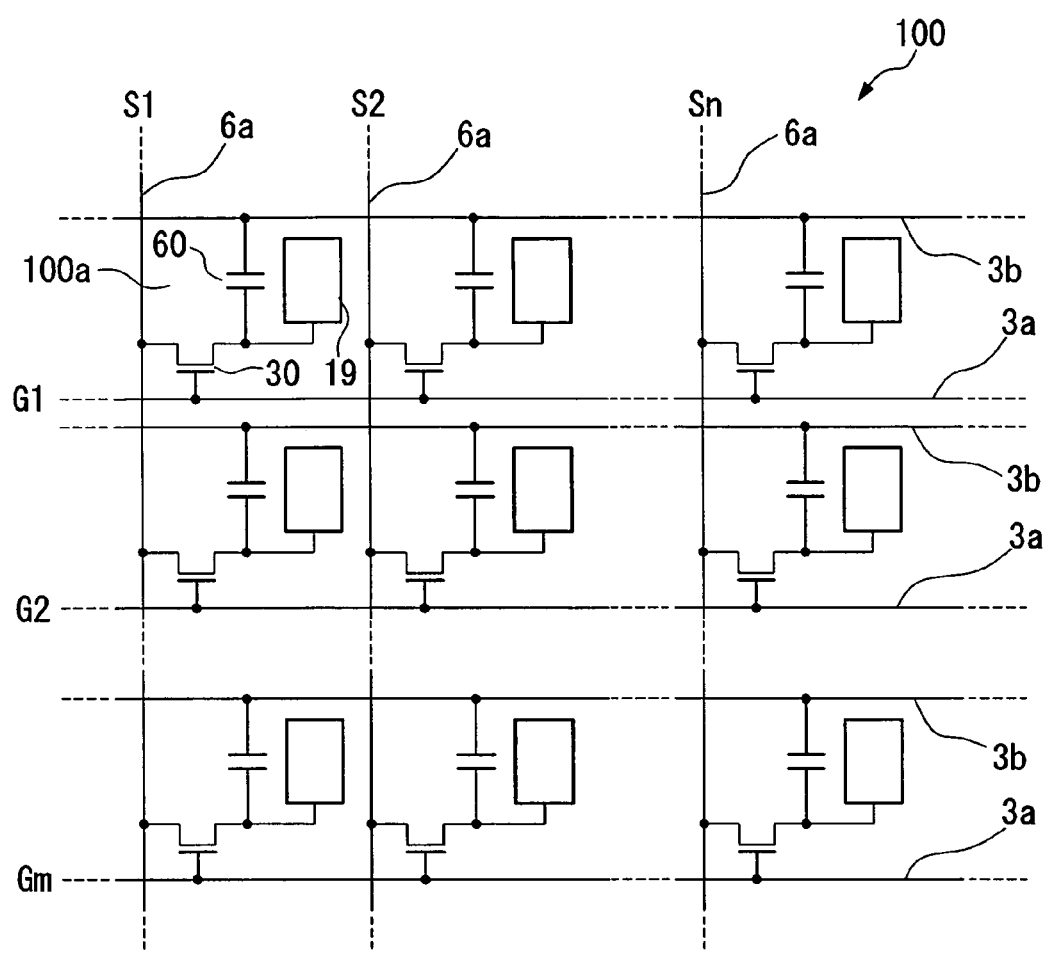
FIG. 11 is an equivalent circuit diagram of the liquid crystal display device.

FIG. 9 is a plan view showing each component of the liquid crystal display device according to the present invention as viewed from an opposing substrate side. FIG. 10 is a sectional view taken along the line H–H' in FIG. 9. FIG. 11 is an equivalent circuit diagram illustrating various devices and wiring in a plurality of pixels formed in a matrix form in the image display region of the liquid crystal display device. FIG. 10 is a partially enlarged sectional view of the liquid crystal display unit. In addition, in respective drawings used for the following explanations, the scale is changed for each layer or each member so that each layer and each member is of a size which can be depicted in the drawing.

In FIGS. 9 and 10, in the liquid crystal display device (electro-optical apparatus) 100 of this embodiment, a TFT array substrate 10 and an opposing substrate 20, which make a pair, are adhered with a sealant 52 which is a photo-curing sealing agent. Liquid crystal 50 is enclosed and held in a region partitioned by this sealant 52. The sealant 52 is formed in the shape of a frame which is closed in a region within the substrate surface, and does not includes any inlet for the liquid crystal and does not have any trace of a seal by the sealant.

A peripheral parting 53 which consists of a light blocking material is formed in the interior region of the formation region of the sealant 52. In the outer region of the sealant 52, a data line driving circuit 201 and the mounting terminal 202 are formed along one side of the TFT array substrate 10, and a scanning line driving circuit 204 is formed along two sides adjacent to this one side. A plurality of wiring 205 for connecting between the scanning line driving circuits 204 provided in both sides of the image display region is provided in the residual one side of the TFT array substrate 10. In addition, in at least one location of corner sections of the opposing substrate 20, an inter-substrate conductive material 206 for electrically connecting between the TFT array substrate 10 and opposing substrate 20 is arranged.

In addition, instead of forming the data line driving circuit 201 and scanning line driving circuit 204 on the TFT array substrate 10, for example, it is also sufficient to electrically and mechanically connect a TAB (Tape Automated Bonding) substrate, in which a driving LSI is mounted, with a terminal block, formed in the peripheral part of the TFT array substrate 10, via an anisotropic conductive film. In addition, in a liquid crystal display device 100, a phase difference plate, a polarizing plate, and the like, are disposed in a predetermined direction according to the type of the liquid crystal 50 to be used, i.e., the kind of modes of operation such as a TN (Twisted Nematic) mode and a STN (Super Twisted Nematic) mode, and a normally white mode/normally black mode; however, illustration thereof is omitted here.

In addition, in the case of constituting the liquid crystal display device 100 for color display, in the opposing substrate 20, color filters of, for example, red (R), green (G), and blue (B) are formed with overcoat in regions which face respective pixel electrodes of the TFT array substrate 10 described below.

In the image display region of the liquid crystal display device 100 having such a structure, as shown in FIG. 11, while a plurality of pixels 100a is constituted in a matrix form, a TFT 30 for pixel switching (switching device) is formed in each of these pixels 100a. Data lines 6a which supply pixel signals S1, S2, . . . , Sn are electrically connected to sources of TFTs 30. The pixel signals S1, S2, . . . , Sn written in the data lines 6a may be supplied line by line in this order, or may be supplied also for every group which is constituted by a plurality of adjacent data lines 6a. In addition, scanning lines 3a are electrically connected to the gates of TFTs 30, and are constituted so that scanning signals G1, G2, . . . , Gm may be applied to the scanning lines 3a line by line in this order at a predetermined timing in a pulse mode.

Each pixel electrode 19 is electrically connected to a drain of each TFT 30, and makes the TFT 30, which is a switching device, turn on only for a fixed period to write each of the pixel signals S1, S2, . . . , Sn supplied from the data lines 6a in each pixel in predetermined timing. Thus, the pixel signals S1, S2, . . . , Sn in predetermined level which are written in the liquid crystals via the pixel electrodes 19 are held for a fixed period between the opposing electrodes 121 of the opposing substrate 20 shown in FIG. 10. In addition, in order to prevent the held pixel signals S1, S2, . . . , Sn from leaking, storage capacitors 60 are added in parallel to liquid crystal capacitors, which each are formed between the pixel electrode 19 and opposing electrode 121. For example, the voltage of the pixel electrode 19 can be held by the accumulating capacitance 60 by a time period that is hundreds of times longer than the interval that the source voltage is applied. Thereby, the holding property of electric charges is improved and it is possible to produce the liquid crystal display device 100 with a high contrast ratio.

Figure 12:
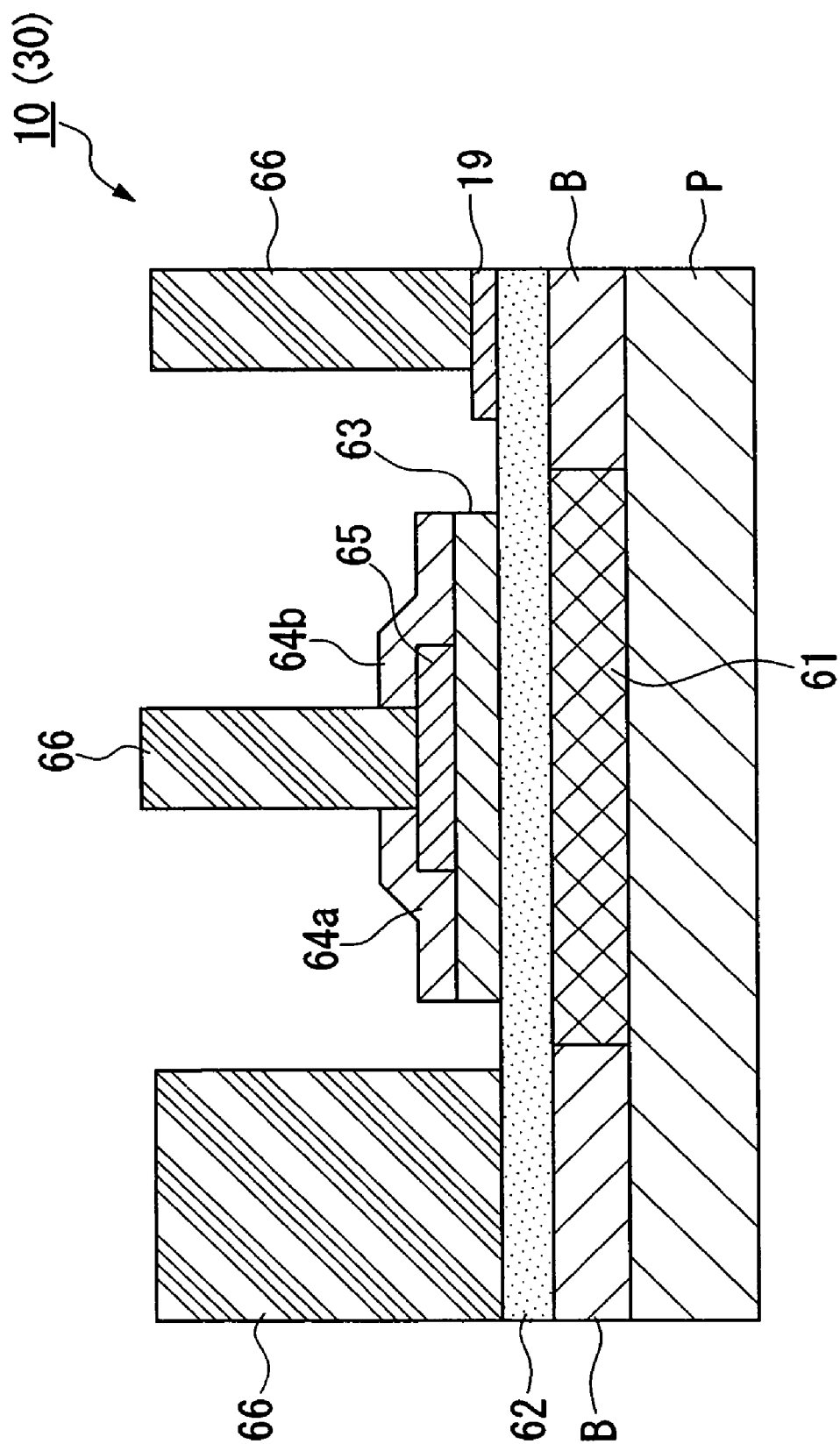
FIG. 12 is a partially enlarged sectional view showing the liquid crystal display device.

FIG. 12 is a partially enlarged sectional view of a liquid crystal display device 100 which has bottom gate TFTs 30, and gate wiring 61 formed by the above-mentioned film pattern formation method is formed on a glass substrate P which constitutes a TFT array substrate 10.

Over this gate wiring 61 there is layered a semiconductor layer 63 which is made from an amorphous silicon (a-Si) film, with the interposition therebetween of a gate insulation layer 62 which is made from SiNe. The portion of the semiconductor layer 63 which opposes this gate wiring portion constitutes a channel region. Upon the semiconductor layer 63, for example in order to provide an ohmic junction, there are junction layers 64a and 64b which are made from a layer of n$^+$ type a-Si, and, above the semiconductor layer 63 at the central portion of the channel region, there is provided an insulating etch stop layer 65 which is made from SiN$_x$, in order to protect the channel region. It should be understood that this gate insulation layer 62, the semiconductor layer 63, and the etch stop layer 65 are patterned as shown in the figure by, after vapor deposition (CVD), performing resist coating, exposure to light, development, and photoetching.

Furthermore, along with forming in the same manner junction layers 64a and 64b and a pixel electrode layer 19 which is made from ITO, they are patterned as shown in the figure by performing photoetching. Banks 66 are provided as projecting above each of the pixel electrode 19, the gate insulation layer 62, and the etch stop layer 65, and it is possible to form source leads and drain leads between these banks 66 by ejecting liquid drops of a silver compound using the liquid drop ejection apparatus IJ which has been explained above.

The liquid crystal display according to this embodiment provides an excellent quality and performance since fine film patterns can be formed with high precision in a stable manner with the film pattern formation method mentioned above.

Furthermore, as a device (electro-optical apparatus) according to the present invention, the present invention is also applicable to a plasma display panel (PDP), and a surface conduction type electron-emitting device, which uses a phenomenon in which electron emission occurs by flowing a current in parallel to a film surface in a thin film with a small area which is formed on the substrate, in addition to the above-described liquid crystal display.

Figure 13:
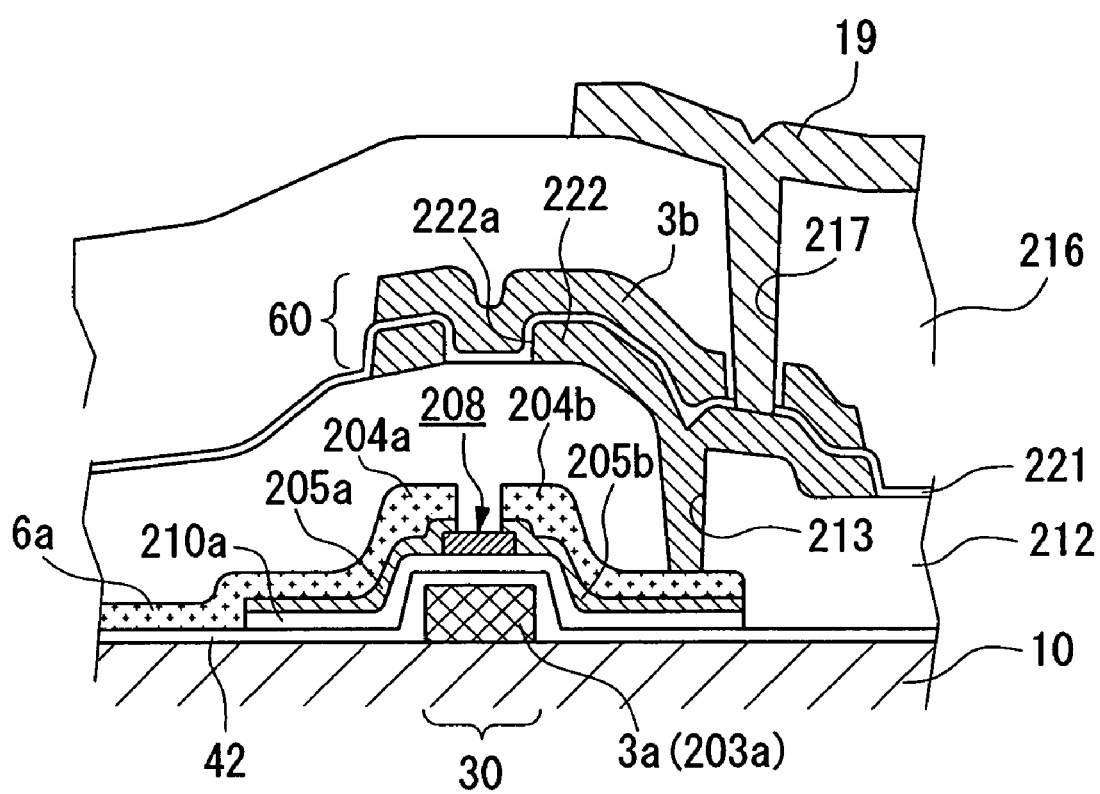
FIG. 13 is a partially enlarged sectional view of the liquid crystal display device.

FIG. 13 is a partially enlarged sectional view of a liquid crystal display device 100 having a bottom gate TFT 30. In this embodiment, each accumulating capacitor 60 is built above the bottom gate TFT 30 for pixel switching. More specifically, a semiconductor layer 210*a* is stacked via a gate insulating film 42 on a gate electrode 203*a* portion projecting on the substrate along the data line 6*a* from the scanning line 3*a* on the TFT array substrate 10 (equivalent to the substrate P in the above-mentioned method for forming a wiring pattern). Let the portion of the semiconductor layer 210*a* which faces this gate electrode 203*a* portion be a channel region. On the semiconductor layer 210*a*, a source electrode 204*a* and a drain electrode 204*b* are formed from the same film as the data line 6*a*. On the end section of the drain electrode 204*b*, an island-like capacitor electrode 222 is stacked via an interlayer insulation film 212. Moreover, on the capacitor electrode 222, a capacitor line 3*b* (capacitor electrode in the fixed potential side) is stacked via a dielectric film 221. Then, the capacitor lines 3*b* are extended in a stripe shape within the image display region, and are extended out of the image display region to be connected to the fixed potential.

The pixel electrode 19 is disposed above the accumulating capacitor 60, and the interlayer insulation film 216 is stacked between the capacity line 3*b* and pixel electrode 19. The pixel electrode 19 and capacity electrode 222 are connected via a contact hole 217 pierced in the interlayer insulation film 216, and making the capacity electrode 222 be pixel electrode potential. Then, in the capacitor electrode 222, a through hole-like opening 222*a* is provided in a region, which is above the channel region of the TFT 30.

The liquid crystal display according to this embodiment provides an excellent quality and performance since fine film patterns can be formed with high precision in a stable manner with the film pattern formation method mentioned above.

In the above-mentioned embodiment, although the TFTs 30 are used as switching devices for the driving of the liquid crystal display device 100, this structure is also applicable to, for example, an organic EL (electroluminescent) display device in addition to a liquid crystal display device. An organic electroluminescent display device has a structure in which a thin film including fluorescent inorganic and organic compounds, is sandwiched by a cathode and an anode. The device generates excitons by injecting electrons and positive holes (holes) into the above-mentioned thin film and exciting them, and makes light emitted by using the emission of light (fluorescence and phosphorescence) when these excitons recombining. Then, it is possible to produce a self-luminescent full-color EL device by patterning materials emitting red, green, and blue luminescent colors respectively, i.e., luminous layer forming materials, and materials forming hole injection/electron transporting layer among the fluorescent materials used for an organic electroluminescent display devices on the substrate which has the above-described TFTs 30 as ink. Devices (electro-optical device) according to the present invention include such an organic EL device.

Figure 14:
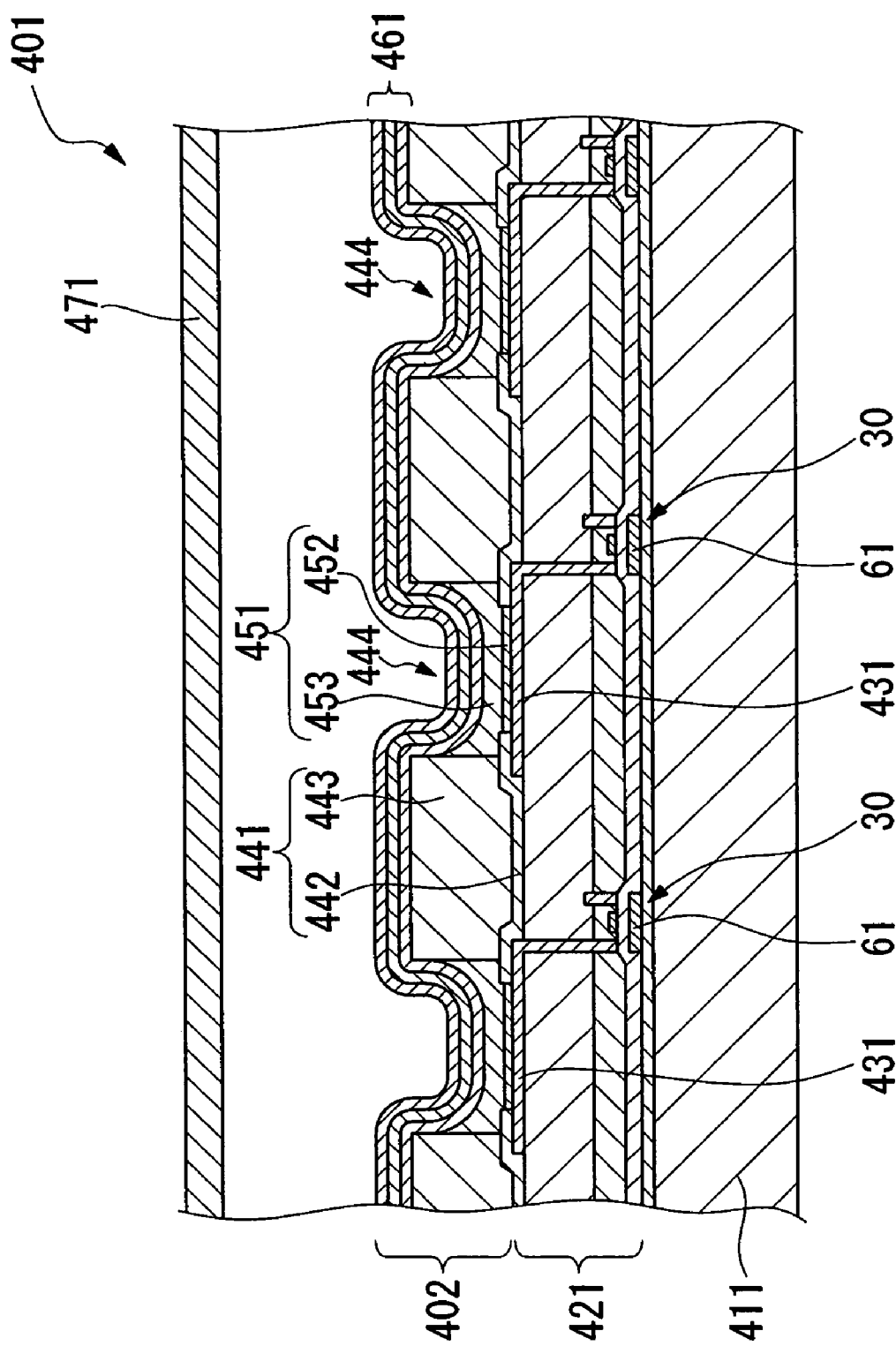
FIG. 14 is a partially enlarged sectional view showing an organic EL device.

FIG. 14 is a side sectional view of an organic EL device of which some of the structural elements have been manufactured by the above-described liquid drop ejection apparatus 100. The basic structure of this organic EL device will now be explained with reference to FIG. 14.

The organic EL device 401 shown in FIG. 14 includes, in an organic EL element 402, a substrate 411, a circuit element section 421, pixel electrodes 431, bank portions 441, luminescent elements 451, a cathode electrode 461 (i.e., an opposing electrode), and a sealing substrate 471, and is connected to lead wires of a flexible substrate (not shown in the figure) and a drive IC (not shown). The circuit element section 421 includes a TFT 60, which is the active element, formed on the substrate 411, and a plurality of pixel electrodes 431 are arranged upon this circuit element section 421. Gate lead lines 61 which are included in the TFT 60 are formed by the method for forming a wiring pattern according to the above-described embodiment.

The bank portions 441 are formed in the shape of a lattice between the various pixel electrodes 431, and luminescent elements 451 are formed in the concave open portions 444 which are defined by these bank portions 441. It should be understood that these luminescent elements 451 are made from an element which emits red light, an element which emits green light, and an element which emits blue light, and thereby this organic EL device 401 is enabled to implement a full color display. The cathode electrode 461 is made upon the entire surface of the upper portions of the bank portions 441 and the luminescent elements 451, and the sealing substrate 471 is layered over this cathode electrode 461.

The manufacturing process for this organic EL device 401 which includes this organic EL element includes a bank portion formation step of forming the bank portions 441, a plasma processing step for suitably forming the luminescent elements 451, a luminescent element formation step for forming the luminescent elements 451, an opposing electrode formation step for forming the cathode electrode 461, and a sealing step for forming the sealing substrate 471 over the cathode electrode 461 for sealing.

The luminescent element formation step is for forming the luminescent elements 451 by forming the positive hole injection layer 452 and the light emitting layer 453 upon the concave open portions 444, in other words upon the pixel electrode 431, it includes a positive hole injection layer formation step and a light emitting layer formation step. The positive hole injection layer formation step includes a first ejection step of ejecting the liquid material for formation of the positive hole injection layer 452 upon each of the pixel electrodes 431, and a first drying step of forming the positive hole injection layer 452 by drying this liquid material which has been ejected. Furthermore, the light emitting layer formation step includes a second ejection step of ejecting the liquid material for formation of the light emitting layer 453 over the positive hole injection layer 452 which has been formed, and a second drying step of forming the light emitting layer 453 by drying this liquid material which has been ejected. It should be understood that, as has been described previously, the light emitting layer 453 is made by disposing three different types of light emitting material—a red light emitting material, a green light emitting material, and a blue light emitting material—corresponding to the three colors, and accordingly the above-mentioned second ejection step includes three different steps of ejecting the three types of material in their respective locations.

In this luminescent element formation step, it is possible to utilize the liquid drop ejection apparatus 100 which has been described above for both the first ejection step in which the positive hole injection layer is formed, and for the second ejection step in which the light emitting layer is formed.

Furthermore, as a device (electro-optical apparatus) according to the present invention, the present invention is also applicable to a plasma display panel (PDP), and a surface conduction type electron-emitting device, which uses a phenomenon in which electron emission occurs by flowing a current in parallel to a film surface in a thin film with a small area which is formed on the substrate, in addition to the above-described liquid crystal display.

Next, an example in which a film pattern formed using the film pattern forming method according to the present invention is applied to a plasma display device will be explained.

Figure 15:
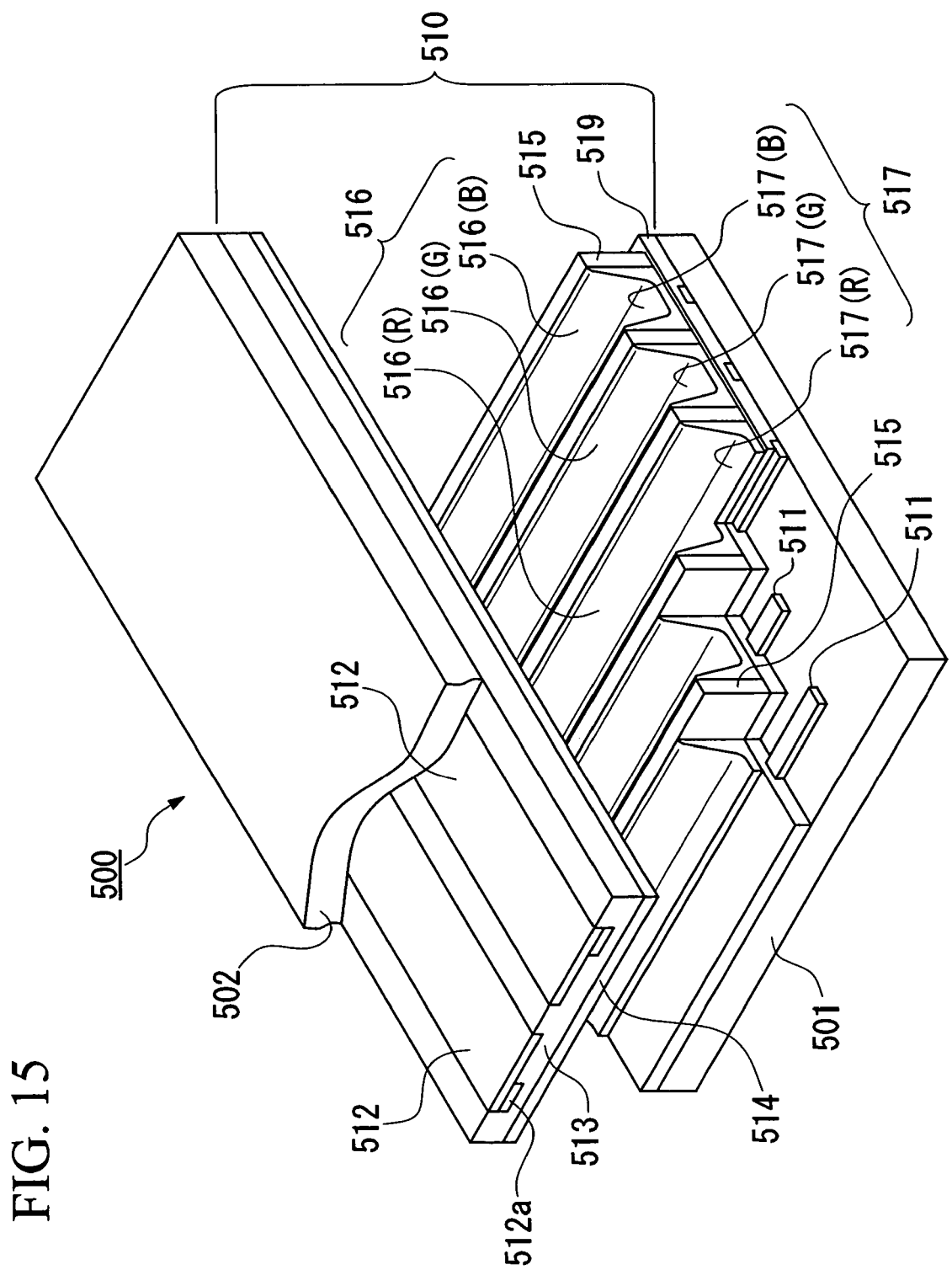
FIG. 15 is an exploded perspective view of a plasma display device.

FIG. 15 is an exploded perspective view of the plasma display device 500 of this embodiment.

The plasma display device 500 includes substrates 501 and 502 which are arranged so as to be facing one another, and an electric discharge display section 510 which is formed between them.

The electric discharge display section 510 is formed as an assembly of a plurality of electric discharge chambers 516. Among these plurality of electric discharge chambers 516, three electric discharge chambers 516—a red color electric discharge chamber 516 (R), a green color electric discharge chamber 516 (B), and a blue color electric discharge chamber (G)—are arranged to be grouped together so as to constitute a single pixel.

Address electrodes 511 are formed upon the upper surface of the substrate 501 in stripe form at predetermined intervals, and a dielectric layer 519 is formed so as to cover the upper surfaces of the address electrodes 511 and the substrate 501.

Separation walls 515 are formed so as to be positioned between adjacent ones of the address electrodes 511 and moreover so as to extend along each of the address electrodes 511. The separation walls 515 include separation walls which lie against the address electrodes 511 to their left and right sides in their widthwise direction, and separation walls which extend in the direction which is orthogonal to the address electrodes 511. Furthermore, electric discharge chambers 516 are defined corresponding to rectangular shaped regions which are partitioned by the separation walls 515.

Yet further, phosphors 517 are disposed in the interiors of the rectangular regions which are defined by the separation walls 515. The phosphors 517 are capable of fluorescing in each of the red, green, and blue, and are arranged so that red color phosphors 517 (R) are present at the bottom portions of the red color electric discharge chambers 516 (R), green color phosphors 517 (G) are present at the bottom portions of the green color electric discharge chambers 516 (G), and blue color phosphors 517 (B) are present at the bottom portions of the blue color electric discharge chambers 516 (B).

On the other hand, a plurality of display electrodes 512 are formed on the substrate 502 in stripe form at predetermined intervals, extending in the direction orthogonal to the previously described address electrodes 511. Furthermore, a dielectric layer 513 and a protective layer made from MgO or the like are formed so as to cover these display electrodes 512.

The substrate 501 and the substrate 502 are adhered together, so that the address electrodes 511 and the display electrodes 512 are mutually orthogonal to one another.

An AC power supply, not shown in the figure, is connected to the above-described address electrodes 511 and display electrodes 512. By supplying power to these electrodes, it is possible to cause excitation of the phosphors 517 in the electric discharge display section 510, and thereby it is possible to provide a color display.

According to this embodiment, it is possible to achieve the miniaturization and thinning and to obtain the high-quality liquid crystal display device without defects such as a short circuit since the address electrodes 511 and the display electrodes 512 are both formed according to the above-described method for forming wiring pattern.

Furthermore, in the above-described embodiment, it is also possible to utilize the pattern formation method according to the present invention for manufacturing, not only the gate lead lines for the TFTs (the thin film transistors), but also others of the structural elements, such as the source electrodes, the drain electrodes, the pixel electrodes, and so on. Next, a method for manufacturing a TFT substrate which is one type of an active matrix substrate will be explained with reference to FIGS. 16–19.

Figure 16:
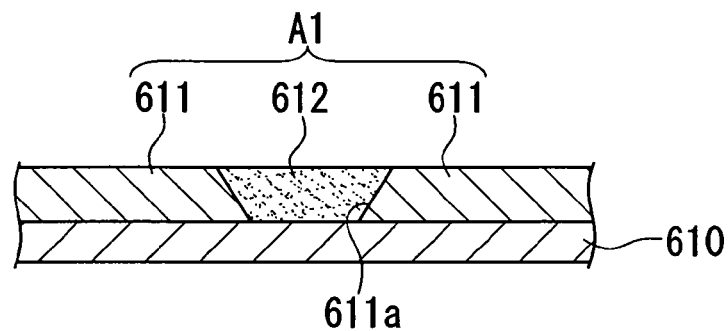
FIG. 16 is a diagram illustrating a step of manufacturing a thin film transistor.

As shown in FIG. 16, first, a first layer of banks 611 for providing grooves 611a of one twentieth to one tenth of one pixel pitch is formed upon the upper surface of a glass substrate 610 which has been cleaned, based upon a photolithography method. As the raw material for these banks 611, it is necessary to utilize a material which, after formation, will be endowed with a transparent characteristic and a liquid repellency; such a raw material may desirably be a high molecular weight material, such as, acrylic resin, polyimide resin, olefin resin, melamine resin, or the like.

However, in order to endow the banks 611 with a liquid repellency after their formation, it is necessary to perform $CF_4$ plasma processing or the like (i.e., plasma processing using a gas which includes fluorine), instead, it would also be acceptable to add a liquid repelling component (fluorine-containing group or the like) in advance to the raw material for the banks 611 itself. In this case, it would be possible to omit the stage of $CF_4$ plasma processing, and the like.

It is preferable to ensure that the contact angle of the ejected ink on the banks 611 which have thus been endowed with a liquid repellency in the above manner is greater than or equal to 40°, and that the contact angle of the ejected ink on the surface of the glass substrate is less than or equal to 10°. In other words, the result which has been verified by the present inventors by an experiment, is that, if acrylic resin is employed as the raw material for the banks 611, it is possible to ensure that the contact angle, after processing with, for example, electrically conductive particles in a solvent of tetradecane, is about 54.0° (while before such processing it was less than or equal to 10°). It should be understood that these contact angles were obtained under the process conditions that the plasma power was 550 W, and the flow rate of the carbon tetrafluoride gas was 0.1 liter/min.

After the above-described first layer bank formation step, in a gate scan electrode formation step (a first electrically conductive pattern formation step), the gate scan electrodes 612 are formed by ejecting liquid drops including an electrically conductive material by an ink jet method, so as to fill up the grooves 611a which are the drawing regions which are separated by the banks 611. When thus forming the gate scan electrodes 612, the pattern formation method according to the present invention is employed.

As the electrically conductive material which is utilized at this time, it is desirable to employ Ag, Al, Au, Cu, palladium, Ni, W—Si, an electrically conductive polymer, or the like. It becomes possible to form a fine wiring pattern for the gate scan electrodes 612 which have been formed in this manner, without any of the material escaping from the grooves 611a, since a sufficient liquid repellency has already been imparted to the banks 611.

By the above-described process, a first electrically conductive layer A1 consisting of the banks 611 and the gate scan electrodes 612, which is provided with a flat upper surface, is formed on the substrate 610.

Furthermore, in order to obtain a satisfactory result for this ejection into the grooves 611a, it is preferable, as shown in FIG. 16, to utilize an tapered shape of these grooves 611a (a tapered shape which widens from the bottom towards the opening from which the ejected drops come in). By doing this, it becomes possible for the liquid drops which have been ejected to penetrate sufficiently deeply.

Figure 17:
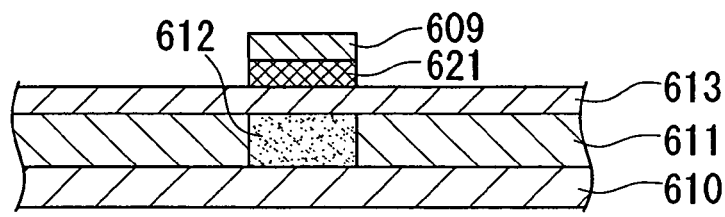
FIG. 17 is a diagram illustrating a step of manufacturing a thin film transistor.

Next, as shown in FIG. 17, a gate insulation layer 613, an active layer 621, and a contact layer 609 are formed in sequence by a plasma CVD method. By varying the source gas species and/or the plasma conditions, a silicon nitride layer is formed as the gate insulation layer 613, an amorphous silicon layer is formed as the active layer 621, and an $n^+$ silicon layer is formed as the contact layer. However, during this formation by the CVD method, thermal hysteresis of 300° C. to 350° C. becomes necessary, it is possible to avoid problems related to transparency and heat resistance by using an inorganic substance for the banks.

Figure 18:
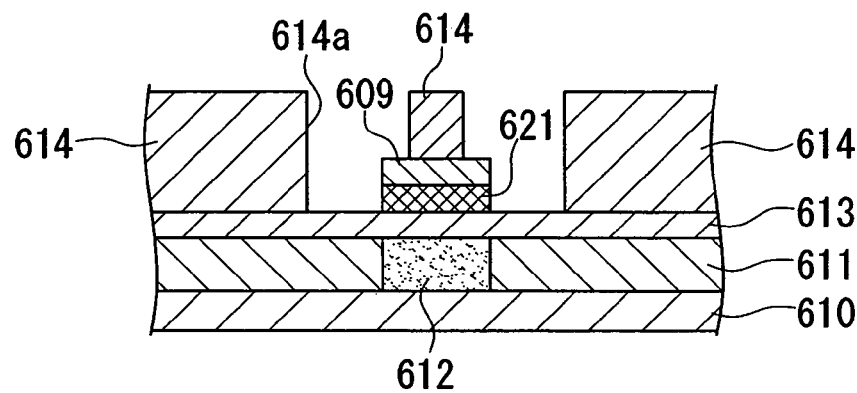
FIG. 18 is a diagram illustrating a step of manufacturing a thin film transistor.

After the above-described semiconductor layer formation step, in a second layer bank formation step, as shown in FIG. 18, a second series of banks 614, for providing grooves 614a which are of width one twentieth to one tenth of one pixel pitch and which extend orthogonally to the grooves 611a, are formed upon the upper surface of the gate insulation layer 613, based upon a photolithography method. As the raw material for these banks 614, it is necessary to utilize a material which, after formation, will be endowed with a transparent characteristic and a liquid repellency; such a raw material may desirably be a high molecular weight material, such as, for example, acrylic resin, polyimide resin, olefin resin, melamine resin, or the like.

However, in order to impart a liquid repellency to the banks 614 after this processing, it is necessary to perform $CF_4$ plasma processing or the like (plasma processing using a gas which includes fluorine), instead of this, it would also be acceptable to add a liquid repelling component (fluorine-containing group or the like) in advance in the raw material for the banks 614 itself. In this case, it would be possible to omit the stage of $CF_4$ plasma processing, and the like.

It is preferable to ensure that the contact angle of the ejected ink on the banks 614 which have thus been endowed with a liquid repellency in the above manner is greater than or equal to 40°.

Figure 19:
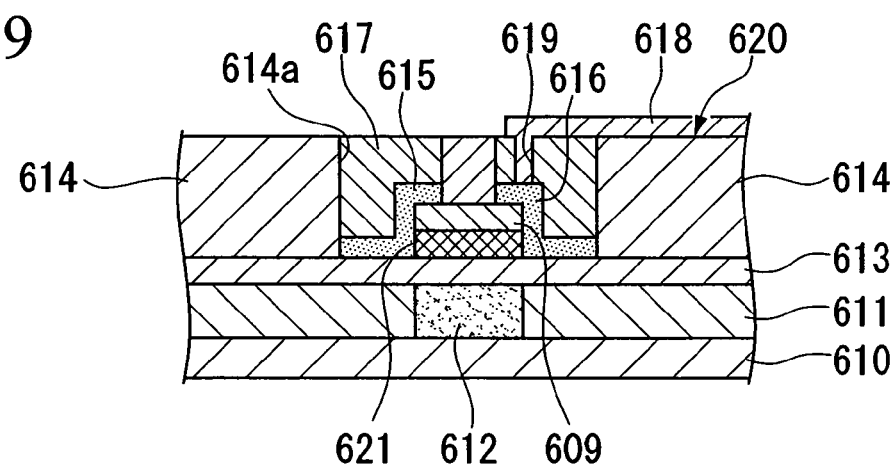
FIG. 19 is a diagram illustrating a step of manufacturing a thin film transistor.

After the above described second layer bank formation step, in a source and drain electrode formation step (a second electrically conductive layer formation step), by ejecting liquid drops of a material which includes an electrically conductive material with an ink jet apparatus so as to fill up within the grooves 614a, which are the drawing regions which are separated by the banks 614, the source electrodes 615 and source electrodes 616 are formed so as to intersect the gate scanning electrodes 612, as shown in FIG. 19. The pattern formation method according to the present invention is utilized when thus forming the source electrodes 615 and the drain electrodes 616.

As the electrically conductive material which is utilized at this time, it is possible and indeed desirable to employ Ag, Al, Au, Cu, palladium, Ni, W—Si, an electrically conductive polymer, or the like. It becomes possible to form a file wiring pattern for the source electrodes 615 and the drain electrodes 616 which have been formed in this manner, without any of the material escaping from the grooves 614a, since a sufficient liquid repellency has already been imparted to the banks 614.

Furthermore, an insulating material 617 is disposed so as to fill up the grooves 614a in which the source electrodes 615 and the drain electrodes 616 have been disposed. By the above process, a flat upper surface 620 is formed on the substrate 610, which consists of the banks 614 and the insulating material 617.

Along with forming contact holes 619 in the insulating material 617, pixel electrodes (ITO) 618 are formed by patterning above the upper surface 620, and, by connecting together the drain electrodes 616 and to the pixel electrodes 618 via these contact holes 619, the TFTs are formed.

Figure 20:
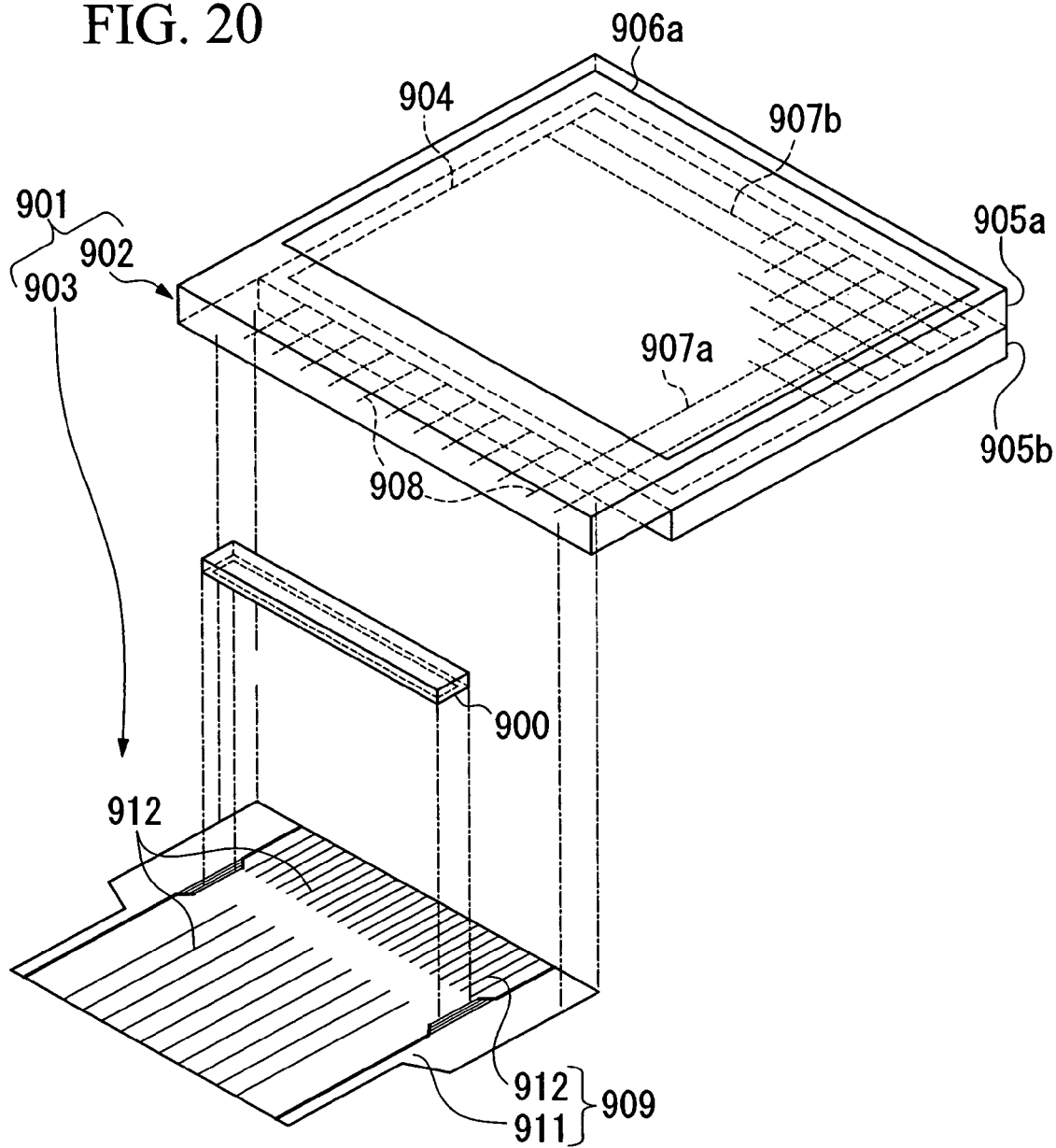
FIG. 20 is a diagram illustrating another embodiment of a liquid crystal display device.

FIG. 20 is a diagram illustrating another embodiment of a liquid crystal display device.

The liquid crystal display device (i.e., the electro-optical device) 901 shown in FIG. 20 generally includes a color liquid crystal panel (electro-optical panel) 902, and a circuit substrate 903 which is connected to this liquid crystal panel 902. Furthermore, according to requirements, an illumination device such as a backlight or the like, and other supplementary devices, may be provided to this liquid crystal panel 902.

This liquid crystal panel 902 includes a pair of substrates 905a and 905b which are fixed together by a seal material 904, and liquid crystal material is filled in the so called cell gap which is defined between these substrates 905a and 905b. These substrates 905a and 905b are generally made from a light transparent material, such as for example glass, a synthetic resin, or the like. On the outer surfaces of the substrates 905a and 905b, there are adhered polarizing plate 906a and another polarizing plate. It should be understood that, in FIG. 20, the other polarizing plate is omitted from the drawing.

Furthermore, electrodes 907a are formed upon the inner surface of the substrate 905a, while electrodes 907b are formed upon the inner surface of the substrate 905b. These electrodes 907a and 907b are made in stripe form, or in the form of letters, digits, or other suitable patterns. Furthermore, these electrodes 907a and 907b are made from a light transparent material, for example, ITO (Indium Tin Oxide) or the like. The substrate 905a has an extension portion which is extended further out than the substrate 905b, and a plurality of terminals 908 are formed upon this extension portion. When forming the electrodes 907a on the substrate 907a, these terminals 908 are formed at the same time as the electrodes 907a. Accordingly, these terminals 908 are formed from, for example, ITO or the like. These terminals 908 extend from the electrodes 907a as members which are integral therewith, and also include portions which are connected to the electrodes 907b via electrically conductive members which are not shown in the figure.

In predetermined positions upon a lead wire substrate 909 in a circuit substrate 903, there are provided semiconductor elements 900 which serve as liquid crystal drive ICs. It should be understood that resistors, capacitors, and other chip components may also be arranged in predetermined positions at locations other than those where these semiconductor elements 900 are positioned, although no such components are shown in the figure. This lead wire substrate 909 is manufactured by forming a wiring pattern 912 by patterning a metallic layer of Cu or the like which has been formed upon a base substrate 911 which is endowed with flexibility, such as for example one made from a polyimide material or the like.

In this embodiment, the electrodes 907a and 907b of the liquid crystal panel 902, and the wiring pattern 912 of the circuit substrate 903, are made by the above-described method for manufacturing a device.

According to the liquid crystal display device of this embodiment, it is possible to obtain a high quality liquid crystal display device in which non-uniformity of the electrical characteristics has been eliminated.

It should be understood that, although the above-described example is a passive type liquid crystal panel, it would also be possible to apply the present invention to an active matrix type liquid crystal panel. In this case, thin film transistors (TFT) would be formed upon one substrate, and a pixel electrode would be formed in correspondence to each TFT. Furthermore, it would also be possible to form the various lead wires which are electrically connected to each of the TFTs (the gate lead line and the source lead line) using an ink jet technique such as the one described above. On the other hand, opposing electrodes and so on are also formed upon the opposing substrate. It is thus also possible to apply the present invention to this type of active matrix liquid crystal panel.

Next, an example in which a film pattern formed using the film pattern forming method according to the present invention is used in an antenna circuit will be explained.

Figure 21:
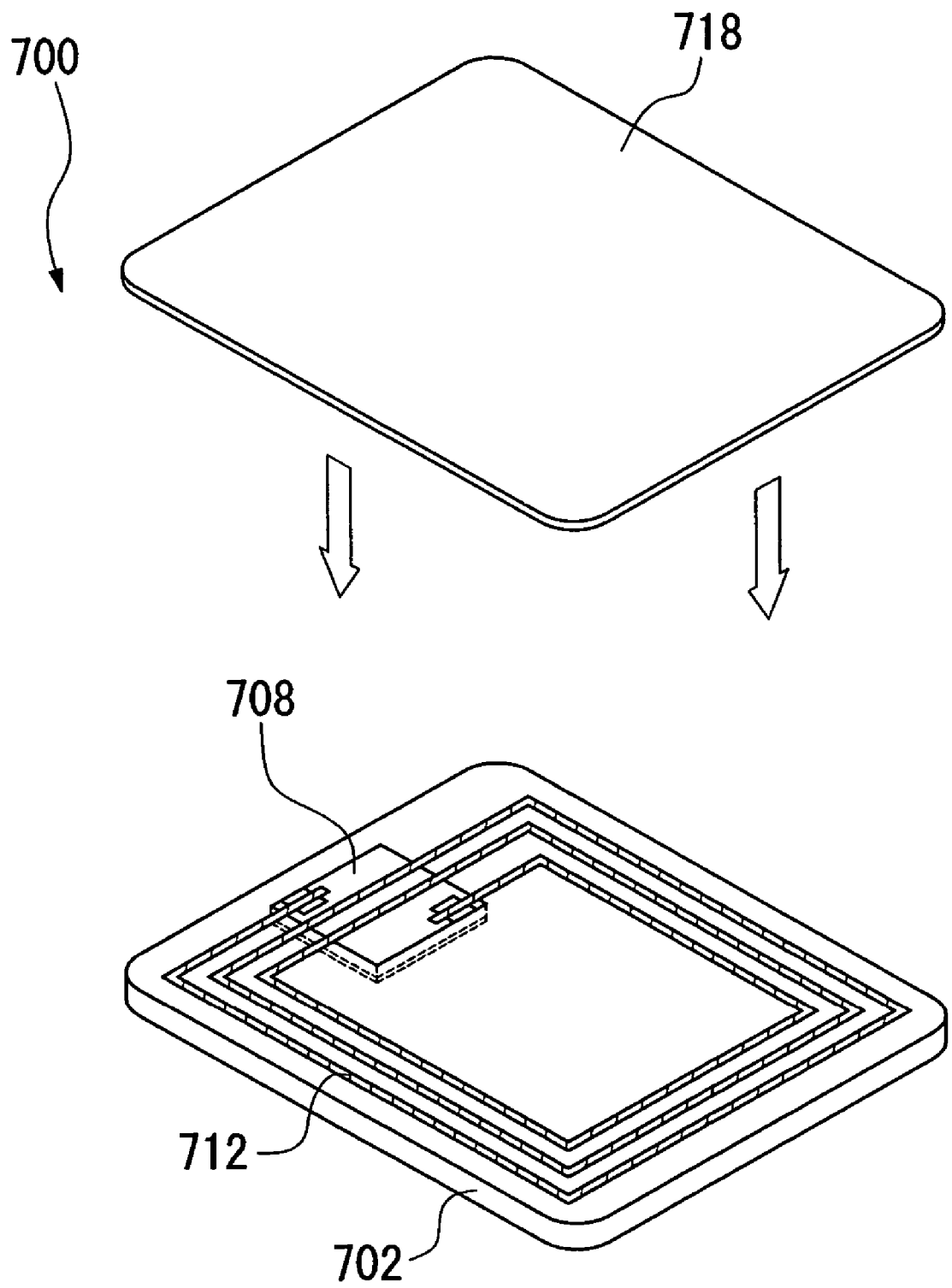
FIG. 21 is an exploded perspective view of a noncontact type card medium.

A noncontact type card medium (electronic apparatus) according to the present invention is shown in FIG. 21. The noncontact type card medium 700 incorporates a semiconductor integrated circuit chip 708 and an antenna circuit 712 in a case including a card base 702 and a card cover 718. At least one of power supply and data transfer is executed by at least one of an electromagnetic wave and electrostatic capacitor coupling with an external transceiver, which are not shown in the figure.

In this embodiment, the above-mentioned antenna circuit 712 is formed based on the film pattern formation method according to the above-mentioned embodiment. Accordingly, it is possible to achieve the miniaturization and thinning and to obtain the high-quality noncontact type card medium 712.

Next, an concrete example of an electronic device according to the present invention will be explained.

Figure 22A:
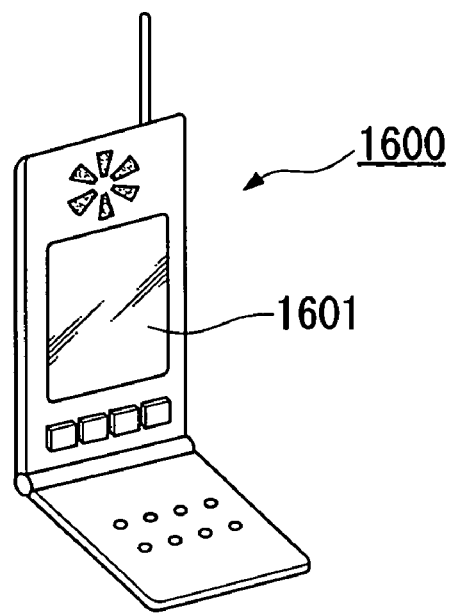
FIGS. 22A–C are diagrams illustrating concrete examples of an electronic device according to the present invention.

FIG. 22A is a perspective view shown an example of a cellular phone. In FIG. 22A, reference numeral 1600 denotes a portable telephone body and numeral 1601 denotes a liquid crystal display section provided with the liquid crystal display device of the above-mentioned embodiment.

Figure 22B:
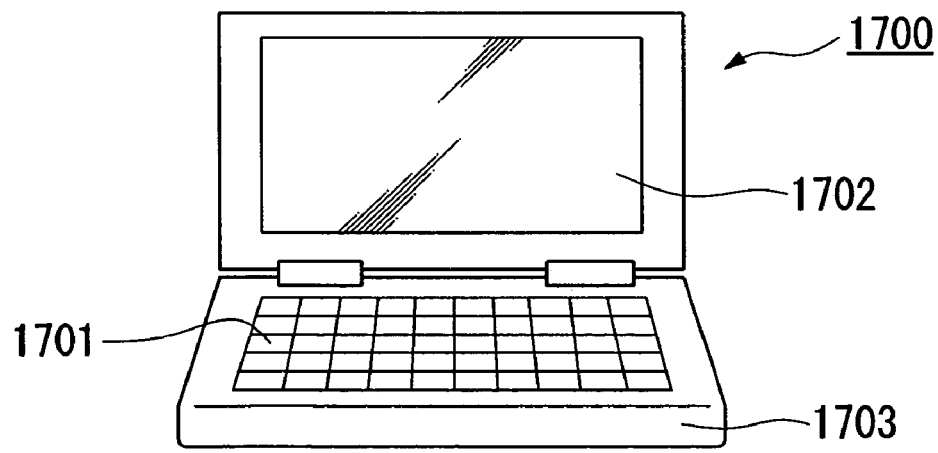

FIG. 22B is a perspective view showing an example of a portable information processing apparatus such as a word processor and a personal computer. In FIG. 22B, reference numeral 1700 denotes an information processing unit, numeral 1701 denotes an input section such as a keyboard, numeral 1703 denotes main body of an information processing unit, and numeral 1702 denotes a liquid crystal display section provided with the liquid crystal display device of the above-mentioned embodiment.

Figure 22C:
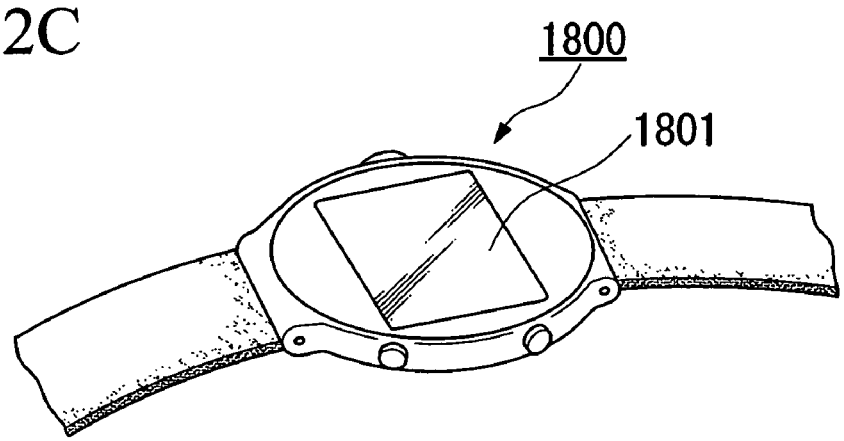

FIG. 22C is a perspective view showing an example of a wristwatch type electronic apparatus. In FIG. 22C, reference numeral 1800 denotes a watch body and numeral 1801 denotes a liquid crystal display section provided with the liquid crystal display device of the above-mentioned embodiment.

Since each of the electronic apparatuses shown in FIGS. 22A–22C includes the liquid crystal display device of the above-mentioned embodiment, it is possible to achieve quality and performance enhancement.

It should be understood that the electronic device according to this embodiment may not only be an electronic device which is equipped with a liquid crystal device, but, alternatively, may be an electronic device which is equipped with other types of electro-optical device, such as an organic electroluminescent display device, a plasma display device, or the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for forming a film pattern on a substrate comprising the steps of:
    forming banks on the substrate; and
    making liquid drops of functional liquid land on the substrate to dispose the liquid drops in an area partitioned by the banks,
    wherein a spacing between the liquid drops are determined so that the liquid drops connect together after they land on the substrate, and
    a position in which a liquid drop of the liquid drops which lands the closest to an end of the area is spaced from the end of the area by less than a half of the spacing between the liquid drops.

2. The film pattern formation method according to claim 1, wherein the distance between a position in which a liquid drop which is located closest to one end of the area is landed and the one end of the area is y/2, where "d" is a length of the area, "h" is the spacing between the liquid drops, and "y" is a remainder obtained by dividing "d" by "h".

3. The film pattern formation method according to claim 1, wherein the functional liquid includes electrically conductive particles.

4. The film pattern formation method according to claim 1, wherein the functional liquid develops electrical conductivity by thermal treatment or irradiation with light.

5. A method for manufacturing a device in which a film pattern is formed on a substrate comprising the step of:
    forming the film pattern on the substrate with the film pattern formation method according to claim 1.

6. A method for manufacturing an active matrix substrate, comprising:
    a first step of forming a gate lead line on a substrate;
    a second step of forming a gate insulation layer on the gate lead line;
    a third step of forming a semiconductor layer on the gate insulation layer;
    a fourth step of forming a source electrode and a drain electrode on the gate insulation layer;
    a fifth step of disposing an insulation material on the source electrode and the drain electrode; and
    a sixth step of forming a pixel electrode which is electrically connected to the drain electrode,
    wherein in at least one of the first, fourth, and sixth steps the film pattern formation method according to claim 1 is used.

7. The film pattern formation method according to claim 1, wherein the end of the area has a short side and a long side, the end of the area being defined by the short side.

8. The method for manufacturing a device according to claim 5, wherein a switching device is provided on the substrate, and the film pattern is a constituent of the switching device.

9. A device which is manufactured using the method for manufacturing a device according to claim 5.

10. An electro-optical device comprising the device according to claim 9.

11. An electronic device comprising the electro-optical device according to claim 10.

12. A method for forming a film pattern on a substrate comprising the steps of:
   forming a liquid repelling layer in a predetermined pattern which is endowed with liquid repellency to functional liquid on the substrate;
   disposing the functional liquid in an area partitioned by the liquid repelling layer,
   wherein a spacing between the liquid drops are determined so that the liquid drops connect together after they land on the substrate, and
   a position in which a liquid drop of the liquid drops which lands the closest to an end of the area is spaced from the end of the area by less than a half of the spacing between the liquid drops.

13. The film pattern formation method according to claim 12, wherein the distance between a position in which a liquid drop which is located closest to one end of the area is landed and the one end of the area is y/2, where "d" is a length of the area, "h" is the spacing between the liquid drops, and "y" is a remainder obtained by dividing "d" by "h".

14. The film pattern formation method according to claim 12, wherein the functional liquid includes electrically conductive particles.

15. The film pattern formation method according to claim 12, wherein the functional liquid develops electrical conductivity by thermal treatment or irradiation with light.

16. A method for manufacturing a device in which a film pattern is formed on a substrate comprising the step of: forming the film pattern on the substrate with the film pattern formation method according to claim 12.

17. A method for manufacturing an active matrix substrate, comprising:
   a first step of forming a gate lead line on a substrate;
   a second step of forming a gate insulation layer on the gate lead line;
   a third step of forming a semiconductor layer on the gate insulation layer;
   a fourth step of forming a source electrode and a drain electrode on the gate insulation layer;
   a fifth step of disposing an insulation material on the source electrode and the drain electrode; and
   a sixth step of forming a pixel electrode which is electrically connected to the drain electrode,
   wherein in at least one of the first, fourth, and sixth steps the film pattern formation method according to claim 10 is used.

18. The film pattern formation method according to claim 12, wherein the end of the area has a short side and a long side, the end of the area being defined by the short side.

19. The method for manufacturing a device according to claim 16, wherein a switching device is provided on the substrate, and the film pattern is a constituent of the switching device.

20. A device which is manufactured using the method for manufacturing a device according to claim 16.

21. An electro-optical device comprising the device according to claim 20.

22. An electronic device comprising the electro-optical device according to claim 21.

* * * * *